(12) United States Patent
Samuelson et al.

(10) Patent No.: US 8,790,462 B2
(45) Date of Patent: Jul. 29, 2014

(54) PRECISELY POSITIONED NANOWHISKERS AND NANOWHISKER ARRAYS AND METHOD FOR PREPARING THEM

(75) Inventors: Lars Ivar Samuelson, Malmö (SE); Bjorn Jonas Ohlsson, Malmö (SE); Thomas M. I. Martensson, Malmö (SE)

(73) Assignee: Qunano AB, Lund (SE)

( * ) Notice: Subject to any disclaimer, the term of this patent is extended or adjusted under 35 U.S.C. 154(b) by 489 days.

(21) Appl. No.: 12/574,014

(22) Filed: Oct. 6, 2009

(65) Prior Publication Data

US 2010/0035412 A1 Feb. 11, 2010

Related U.S. Application Data

(63) Continuation of application No. 10/751,944, filed on Jan. 7, 2004, now Pat. No. 7,608,147.

(60) Provisional application No. 60/459,989, filed on Apr. 4, 2003, provisional application No. 60/472,721, filed on May 23, 2003, provisional application No. 60/512,771, filed on Oct. 21, 2003, provisional application No. 60/524,891, filed on Nov. 26, 2003.

(51) Int. Cl.
| | |
|---|---|
| *C30B 25/00* | (2006.01) |
| *C30B 29/40* | (2006.01) |
| *B82Y 30/00* | (2011.01) |
| *B82Y 10/00* | (2011.01) |
| *C30B 11/00* | (2006.01) |
| *C30B 29/60* | (2006.01) |
| *C30B 11/12* | (2006.01) |

(52) U.S. Cl.
CPC ............ *C30B 11/00* (2013.01); *C30B 29/40* (2013.01); *B82Y 30/00* (2013.01); *B82Y 10/00* (2013.01); *C30B 29/605* (2013.01); *C30B 11/12* (2013.01)
USPC ................. 117/89; 117/84; 117/88; 117/40; 117/68; 117/12; 117/939

(58) Field of Classification Search
USPC .............. 117/84, 88, 89, 40, 68, 12, 939
See application file for complete search history.

(56) References Cited

U.S. PATENT DOCUMENTS

| | | | |
|---|---|---|---|
| 5,196,396 | A | 3/1993 | Lieber |
| 5,252,835 | A | 10/1993 | Lieber et al. |

(Continued)

FOREIGN PATENT DOCUMENTS

| | | |
|---|---|---|
| CN | 12119985 A | 6/1999 |
| EP | 0 443 920 | 8/1991 |

(Continued)

OTHER PUBLICATIONS

Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.

(Continued)

*Primary Examiner* — Matthew Song
(74) *Attorney, Agent, or Firm* — The Marbury Law Group PLLC

(57) ABSTRACT

A nanoengineered structure comprising an array of more than about 1000 nanowhiskers on a substrate in a predetermined spatial configuration, for use for example as a photonic band gap array, wherein each nanowhisker is sited within a distance from a predetermined site not greater than about 20% of its distance from its nearest neighbour. To produce the array, an array of masses of a catalytic material are positioned on the surface, heat is applied and materials in gaseous form are introduced such as to create a catalytic seed particle from each mass, and to grow, from the catalytic seed particle, epitaxially, a nanowhisker of a predetermined material, and wherein each mass upon melting, retains approximately the same interface with the substrate surface such that forces causing the mass to migrate across said surface are less than a holding force across a wetted interface on the substrate surface.

27 Claims, 7 Drawing Sheets

(56) References Cited

U.S. PATENT DOCUMENTS

| | | | |
|---|---|---|---|
| 5,332,910 | A | 7/1994 | Haraguchi et al. |
| 5,362,972 | A | 11/1994 | Yazawa et al. |
| 5,381,753 | A | 1/1995 | Okajima et al. |
| 5,544,617 | A | 8/1996 | Terui et al. |
| 5,702,822 | A | 12/1997 | Terui et al. |
| 5,772,905 | A | 6/1998 | Chou |
| 5,840,435 | A | 11/1998 | Lieber et al. |
| 5,858,862 | A | 1/1999 | Westwater et al. |
| 5,897,945 | A | 4/1999 | Lieber et al. |
| 5,899,734 | A | 5/1999 | Lee |
| 5,976,957 | A | 11/1999 | Westwater et al. |
| 5,997,832 | A | 12/1999 | Lieber et al. |
| 6,081,113 | A | 6/2000 | Tomita et al. |
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,307,241 | B1 | 10/2001 | Awschalom et al. |
| 6,340,822 | B1 | 1/2002 | Brown et al. |
| 6,451,113 | B1 | 9/2002 | Givargizov |
| 6,458,206 | B1 | 10/2002 | Givargizov et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0121764 | A1 | 7/2003 | Yang et al. |
| 2003/0200521 | A1 | 10/2003 | DeHon et al. |
| 2004/0082178 | A1 | 4/2004 | Tamins et al. |
| 2004/0213307 | A1 | 10/2004 | Lieber et al. |
| 2005/0164432 | A1 | 7/2005 | Lieber et al. |

FOREIGN PATENT DOCUMENTS

| | | |
|---|---|---|
| EP | 0 483 579 B1 | 12/1995 |
| EP | 0 838 865 | 4/1998 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO D1/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 03/005450 | 1/2003 |
| WO | WO 03/027011 A2 | 4/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

Haraguchi, K. et al., "GaAs p-n junction formed in quantum wire crystals" *Applied Physics Letters*, Feb. 10, 1992, pp. 745-747, vol. 60, No. 6.

Yazawa, M., et al., "Effect of one monolayer of surface gold atoms on the epitaxial growth of InAs nanowhiskers" *Applied Physics Letters*, Oct. 26, 1992, pp. 2051-2053, vol. 61.

Yazawa, M., "Nanocolumns composed of GaAs-InAs jointed whiskers and SiO2 covers" *Applied Physics Letters*, Aug. 29, 1994, pp. 1157-1158, vol. 65.

Sato, T., "Site-controlled growth of nanowhiskers", *Applied Physics Letters*, Jan. 9, 1995, pp. 159-161, vol. 66.

Hiruma, K., et al., "Growth and optical properties of nanometerscale GaAs and InAs whiskers", *Applied Physics Review*, Jan. 15, 1995, pp. 447-462, vol. 77.

Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.

Hiruma, K., et al., "Gas free-standing quantum-size wires" *Journal of Applied Physics*, Sep. 1, 1993, pp. 3162-3171, vol. 74.

Haraguchi, K., et al., "Polarization dependence of light emitted from GaAs p-n junctions in quantum wire crystals", *Journal of Applied Physics*, Apr. 15, 1994, pp. 4220-4225, vol. 75.

Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.

Lieber, C., "Nanowires as Building Blocks for Nanoscale Science and Technology", *Abstracts of Papers of the Amer. Chem Soc.*, Aug. 18, 2002, pp. 033-Camp Part 1, vol. 224.

Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676-Inor Part 1, vol. 219.

Duan, X. et al., "Laser Assisted Catalytic Growth of Semiconductor Nanowires for Nanoscale Electronic Optoelectronic Device Application" *Abstracts of Papers of- the Amer. Chem. Soc.*, Apr. 1, 2001, pp. 644-Inor Part 1, vol. 221.

Lieber, C., "Semiconductor Nanowires: Building Blocks for Nanoscale Science and Technology", *Abstracts of Papers of- the Amer. Chem. Soc.*, Aug. 1, 2001, pp. 383-Phys Part 2, vol. 222.

Huang, Y., et al., "Integrated Optoelectronics Assembled from Semiconductor Nanowires", *Abstracts of Papers of- the Amer. Chem. Soc.*, Aug. 18, 2002, pp. 039-Phys Part 2, vol. 224.

Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.

Duan, X. et al., "General Synthesis of Compound Semiconductor Nanowires", *Advanced Materials*, Jan. 1, 2000, pp. 298-302, vol. 12, No. 4.

Duan, X., et al., "Synthesis and optical properties of gallium arsenide nanowires", *Applied Physics Letters*, Feb. 28, 2000, pp. 1116-1118, vol. 76, No. 9.

Cui, Y., et al., "Diameter-controlled synthesis of single-crystal silicon nanowires", *Applied Physics Letters*, Apr. 9, 2001, pp. 2214-2216, vol. 78, No. 15.

Gudiksen, M.S., et al., "Diameter-selective synthesis of semiconductor nanowires", *J. Am. Chem. Soc.*, Aug. 22, 2000, pp. 8801-8802, vol. 122.

Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.

Duan, X., et al., "Laser-Assisted Catalytic Growth of Single Crystal GaN Nanowires" *Journal of Amer. Chem. Soc.*, Dec. 18, 1999, pp. 188-189, vol. 122, No. 1.

Huang, Y., et al., "Gallium Nitride Nanowire Nanodevices", *Nano Letters*, Jan. 11, 2002, pp. 81-82, vol. 2, No. 2.

Lieber, C., "Nanowire Sugerlattices", *Nano Letters*, Jan. 25, 2002, pp. 82-82, vol. 2, No. 2.

Duan, X., et al., "Nonvolatile Memory and Programmable Logic from Molecule-Gated Nanowires", *Nano Letters*, May 1, 2002, pp. 487-490, vol. 2, No. 5.

Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics" *Nature*, Feb. 7, 2002, , pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

(56) References Cited

OTHER PUBLICATIONS

Duan, X., "Single-nanowire electrically driven lasers" *Nature*, Jan. 16, 2003, pp. 241-244, vol. 421.
Lieber, C., "The incredible shrinking circuit", *Sci. Am.*, Sep. 1, 2001, pp. 58-64, vol. 285.
Morales, A., et al., "A Laser Ablation Method for the Synthesis of Crystalline Semiconductor Nanowires", *Science*, Jan. 9, 1998, pp. 208-211, vol. 279.
Cui, Y., et al., "Functional Nanoscale Electronic Devices Assembled Using Silicon Nanowire Building Blocks", *Science*, Feb. 2, 2001, pp. 851-853, vol. 291.
Wang, J., et al., "Highly Polarized Photoluminesence and Photodetection from Single Indium Phosphide Nanowires", *Science*, Aug. 24, 2001, pp. 1455-1457, vol. 293, No. 5534.
Cui, Y., et al., "Nanowire nanosensors for highly sensitive and selective detection of biological and chemical species", *Science*, Aug. 17, 2001, pp. 1289-1292, vol. 293.
Huang, Y., et al., "Logic Gates and Computation from Assembled Nanowire Building Blocks", *Science*, Nov. 9, 2001, pp. 1313-1317, vol. 294.
Cui, Y., et al., "Doping and Electrical Transport in Silicon Nanowires", *The Journal of Physical Chemistry B*, May 11, 2000, pp. 5213-5216, vol. 104, No. 22.
Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.
Morales, A., et al., "Rational Synthesis of Silicon Nanowires", *INOR*, 651, Jan. 1, 2001.
Wong, E., et al., "Nanobeam Mechanics: Elasticity, Strength, and Toughness of Nanorods and Nanotubes" *Science*, Sep. 26, 1997, pp. 1971-1975, vol. 277.
Dai, H., et al., "Synthesis and Characterization of Carbide Nanorods", *Nature*, Jun. 29, 1995, pp. 769-772, vol. 375.
Junno, T., et al., "Controlled manipulation of nanogarticles with an atomic force microscope", *Applied Physics Letters*, Jun. 26, 1995, pp. 3627-3629, vol. 66.
Zwiller, V., et al., "Single quantum dots emit single photons at a time: Antibunching experiment", *Applied Physics Letters*, Apr. 23, 2001, pp. 2476-2478, vol. 78, No. 17.
Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.
Thelander, et al., "Gold manoparticle single-electron transistor with carbon nanotube leads", *Applied Physics Letters*, Sep. 24, 2001, pp. 2106-2108, vol. 79, No. 13.
Ohlsson, B.J., et al., "Size-, shape-, and position-controlled GaAs nono-whiskers", *Applied Physics Letters*, Nov. 12, 2001, pp. 3335-3337, vol. 79, No. 20.
Bjork, M.T., et al., :One-dimensional heterostructures in semiconductor nanowhiskers, *Applied Physics Letters*, Feb. 11, 2002, pp. 1058-1060, vol. 80, No. 6.
Persson, M.P. et al., "Electronic Structure of Nanometer-Scale GaAs Whiskers", *Applied Physics Letters*, Aug. 12, 2002, pp. 1309-1311, vol. 81, No. 7.
Thelander, C., et al., "Single-Electron Transistors in Heterostructure Nanowires", *Applied Physics Letters*, Sep. 8, 2003, pp. 2052-2054, vol. 83, No. 10.
Panev, N., et al., "Sharp Exciton Emission From Single InAs Quantum Dots in GaAs Nanowires", *Applied Physics Letters*, Sep. 15, 2003, pp. 2238-2240, vol. 83, No. 11.
Bjork, M.T., "Nanowire resonant tunelling diodes", *Applied Physics Letters*, Dec. 2, 2002, pp. 4458-4460, vol. 81, No. 23.
Persson, A., "Oriented Growth of InAs-based Nanowhiskers", *Diploma Work, Lund Institute of Technology, Lund Unversity*, May 29, 2001, pp. 1-48.
Ohlsson, J., "Semiconductor Hetero- and Nanostructures" *Doctoral Thesis, Lund Institute of Technology, Lund University*, Nov. 23, 2001.
Thelander, C., "Quantum Devices from the Assembly of Zero-and One-Dimensional Building Blocks", *Doctoral Thesis, Lund University*, Nov. 7, 2003.
Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.
Magnusson, M., et al.,"Gold nanogarticles: Production, reshaping, and thermal charging", *Journal of Nanoparticle Research*, Jan. 1, 1999, pp. 243-251, vol. 1.
Samuelson, L., "Self-Forming Nanoscale Devices", *Materials Today*, Oct. 22, 2003, pp. 22-31.
Ohlsson, B., et al., "Fabrication and characterization of III-V nanowhiskers", *M$$10 Conference—Austria*, Jul. 23-27, 2001.
Bjork, M.T., et al., "One-dimensional Steeplechase for Electrons Realized", *Nano Letters*, Jan. 19, 2002, pp. 87-89, vol. 2, No. 2.
Martensson, T., et al., "Fabrication of Individually Seeded Nanowire Arrays by Vapour-Liquid-Solid Growth", *Nanotechnology*, Oct. 17, 2003, pp. 1255-1258, No. 14.
Burgess, D.S., "Nanowire Heterostructures Form Tunneling Diodes", *Photonics Spectra*, pp. 3-5, vol. 37, No. 2.
Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.
Ohlsson, B.J., et al., "Growth and characterization of GaAs and InAs nano-whiskers and InAs/GaAs heterostructures", *Physica E*, Mar. 1, 2002, pp. 1126-1130, No. 13.
Samuelson, L., et al., "Tunnel-Induced Photon Emission in Semiconductors Using an STM", *Physica Scripta*, Jan. 1, 1992, pp. 149-152, vol. T42.
Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.
Persson, M., "Tight-Binding Simulation of Nanocrystalline Particles and Whiskers", *Tekn lic thesis, Lund University*, Aug. 1, 2002.
Bjork, M., "Semiconductor Nanowires and Devices", *Tekn lic thesis, Lund University*, Nov. 1, 2002.
Murphy, C.J., et al., "Controlling the Aspect Ratio of Inorganic Nanorods and Nanawires", *Advanced Materials*, Jan. 4, 2002, pp. 80-82, vol. 14, No. 1.
Wagner, R.S., et al., "Vapour-Liquid-Solid Mechanism of Single Crystal Growth" *Applied Physics Letters*, Mar. 1, 1964, pp. 89-90, vol. 4, No. 5.
Canham, L.T., "Silicon Quantum Wire Array Fabrication by Electrochemical and Chemical Dissolution of Wafers", *Applied Physics Letters*, Sep. 3, 1990, pp. 1046-1048, vol. 57.
Koga, T., et al., "Carrier Pocket Engineering Applied to Strained . . ", *Applied Physics Letters*, Oct. 18, 1999, pp. 2438-2440, vol. 75.
Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.
Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.
Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.
Ferry, D.K., et al., "Transport in Nanostructures" *Cambridge University Press*, Hardcover, Jan. 1, 1997, pp. 41-45 and 91-96.
Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.
Mullins, J., "News analysis: using unusable frequencies", IEEE Spectrum, Jul. 1, 2002, pp. 22-23, vol. 39, No. 7.
Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.
Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.
Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

(56) References Cited

OTHER PUBLICATIONS

Matthews, J., et al., "Defects in Epitaxial Multillayers", *Journal of Crystal Growth*, Jan. 1, 1974, pp. 118-125, vol. 27.
Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.
Sakaki, H., "Scattering Suppression and High-Mobility Effect of Size-Quantized Electrons in Ultrafine Semiconductor Wire Structures" *Japanese Journal of Applied Physics*, Dec. 1, 1980, pp. L735-L738, vol. 19, No. 12.
Scheibel, H., et al., "Generation of Monodisperse Ag- and NaCI Aerosols With Particle Diameters Between 2 and 300 nm", *Journal of Aerosol Science*, Jan. 1, 1983, pp. 113-126, vol. 14, No. 2.
Knutson, E., et al., "Aerosol Classification by Electric Mobility: Apparatus, Theory, and Applications", *Journal of Aerosol Science*, Jan. 1, 1975, pp. 443-451, vol. 6.
Miller, M., et al., "Serpentine Superlattice: Concept and First Results", *Journal of Crystal Growth*, Jan. 1, 1991, pp. 323-327, vol. 111.
Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.
Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.
Givargizov, E.I., "Fundamental Aspects of VLS Growth", *Journal of Crystal Growth*, Jan. 1, 1975, pp. 20-30, vol. 31.
Derycke, V., et al., "Carbon Nonotube Inter- and Intramolecular Logic Gates", *Nano Letters*, Aug. 26, 2001, pp. 453-456, vol. 1, No. 9.
Iijima, S., "Helical microtubules of graphitic carbon", *Nature*, Nov. 7, 1991, pp. 56-58, vol. 354.
Yao, Z., et al., "Carbon Nanotube Intramolecular Junctions", *Nature*, Nov. 18, 1999, pp. 273-276, vol. 402.
Bennett, C., et al., "Quantum information and computation", *Nature*, Mar. 16, 2000, pp. 247-255, vol. 404.
Michler, P. et al., "Quantum correlation among photons from a single quantum dot at room temperature", *Nature*, Aug. 31, 2000, pp. 968-970, vol. 406, No. 6799.
Chow, E., et al., "Three-dimensional control of light in a two-dimensional photonic crystal slab", *Nature*, Oct. 26, 2000, pp. 983-986, vol. 407.
Venkatasubramanian, R., et al., "Thin-Film Thermoelectric Devices with High Room-Temperature Figures of Merit", *Nature*, Oct. 11, 2003, pp. 597-602, vol. 413.
Bachtold, A., et al., "Scanned probe microscopy of electronic transport in carbon nanotubes", *Phys. Rev. Lett.*, Jun. 26, 2000, pp. 6082-6085, vol. 84, No. 26.
Hicks, L.D., et al., "Thermoelectric Figure of Merit of a One-Dimensional Conductor", *Physical Review B*, Jun. 15, 1993, pp. 16631-16634, vol. 47, No. 24.
Itskevich, I.E., et al., "Resonant magnetotunneling through individual self-assembled InAs quantum dots", *Physical Review B*, Dec. 15, 1996, pp. 16401-16404, vol. 54, No. 23.
Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.
Kapon, E., et al., "Stimulated Emission in Semiconductor Quantum Wire Heterostructures", *Physical Review Letters*, Jul. 24, 1989, pp. 430-433, vol. 63, No. 4.
Santori, C., et al., "Triggered Single Photons from a Quantum Dot", *Physical Review Letters*, Feb. 19, 2001, pp. 1502-1505, vol. 86, No. 8.
Capasso, F., et al., "Quantum Cascade Lasers", *Physics Today*, May 1, 2002, pp. 34-40.
Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.
Zhang, Y., et al., "Heterostructures of Single-Walled Carbon Nanotubes and Carbide Nanorods", *Science*, Sep. 10, 1999, pp. 1719-1722, vol. 285.
Holmes, J., et al., "Control of Thickness and Orientation of Solution-Grown Silicon Nanowires", *Science*, Feb. 25, 2000, pp. 1471-1473, vol. 287.
Zhou, C.W., et al., "Modulated chemical doping of individual carbon nanotubes", *Science*, Nov. 24, 2000, pp. 1552-1555, vol. 290.
Favier, F., et al., "Hydrogen Sensors and Switches from Electrodeposited Palladium Mesowire Arrays", *Science*, Sep. 21, 2001, pp. 2227-2231, vol. 293.
Bachtold, A., et al., "Logic circuits with carbon nanotube transistors", *Science*, Nov. 9, 2001, pp. 1317-1320, vol. 294.
Nicewarner-Pena, S.R., et al., "Submicrometer metallic barcodes", *Science*, Oct. 5, 2001, pp. 137-141, vol. 294.
Service, R.F., "Nanowire Fabricators Earn Their Stripes", *Science*, Jan. 1, 2002, pp. 946-947, vol. 295, No. 5557.
Awschalom, D.D. et al., "Spintronics", *Scientific American*, Jun. 1, 2002, pp. 66-73, vol. 286, No. 6.
Henning, P., et al., "Compositional information from amorphous Si—Ge multilayers using high-resolution electron microscopy imaging and direct digital recording", *Ultramicroscopy*, Jan. 1, 1996, pp. 221-235, vol. 66.
Wagner, R.S., "VLS Mechanism of Crystal Growth", *Whisker Technology, A.P. Levitt, ed.*, Chapter 3, Jan. 1, 1970, pp. 47-119.
Alferov, Z., et al., "For developing semiconductor heterostructures used in high-speed-and opto-electronics", Nov. 23, 2000, www.nobel.se.physics/laureates/2000/.
Von Klitzing, K., "For the discovery of the quantized Hall effect", Jun. 16, 2000, www.nobel.se/physics/laureates/1985/.
Laughlin, R.B., et al., "For their discovery of a new form of quantum fluid with frictionally charged excitations", Jun. 16, 2000, www.nobel.se/physics/laureates/1998/.
Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.
Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.
Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.
Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.
Kempa, K., et al., "Photonic Crystals Based on Periodic Arrays of Aligned Carbon Nanotubes", *Nano Letters*, Nov. 19, 2002, pp. 13-18, vol. 3, No. 1.
Takahashi, H., et al., "Formation and Characteristics of 100 nm Scale GaAs Quantum Wires by Selective Area MOVPE", *Applied Surface Science*, No. 216, Jan. 1, 2003, pp. 402-406.
Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.
Kamins, T.I., et al., "Self-Assembled Silicon Nanowires for Integrating Microsystems, Nanoelectronics and Microelectronics", *mstnews*, Mar. 2003, Mar. 1, 2003.
Wu, Y., et al., "Rational Synthesis of Inorganic Nanowires", *Abstracts of Papers in the Amer. Chem. Soc.*, Apr. 1, 2001, pp. 108-lec Part 1, vol. 221.
Yang, P., et al., "Nanowires from Vapor Condensation and their Assemblies", *Abstracts of Papers in the Amer. Chem. Soc.*, Mar. 26, 2000, pp. 269-Inor Part 1, vol. 219.
Huang, M., et al., "Nanowire Array as Potential 2-d Photonic Bandgap Materials" *Abstracts of Paners in the Amer. Chem. Soc.*, Apr. 1, 2001, pp. 95-Phys Part 2, vol. 221.

(56) References Cited

OTHER PUBLICATIONS

Yang, P., et al., "Inorganic Nanowires: Rational Synthesis, Functional Assemblies and Novel Properties", *Abstracts of Papers in the Amer. Chem. Soc.*, Apr. 7, 2002, pp. 343-Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures" *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning" *Journal of the Amer. Chem. Soc.*, Sep. 29, 2000, pp. 10232-10233, vol. 122, No. 41.

Song, J., et al., "MMo$_3$Se$_3$ (M=Li+,Na', Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$—as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology" *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

Carlberg et al., "Lift-Off Process for Nanoimprint Lithography," Microelectronic Engineering 67-68, 2003, pp. 203-207.

Martensson et al., "Nanowire Arrays Defined by Nanoimprint Lithography," Nano Letters, vol. 4, No. 4, 2004, pp. 699-702.

Nanoimprint Lithography, Wikipedia, Dec. 19, 2006, pp. 1-4.

English translation of Office Action mailed Jan. 23, 2009, in corresponding Chinese Patent Application No. 200480015494.5, 15 pages.

Li et al., "Ordered semiconductor ZnO nanowire arrays and their photoluminescence properties," Appl. Phys. Lett., Apr. 10, 2000, 76(15):2011-2103.

Bai et al., "Synthesis and photoluminescence properties of semiconductor nanowires," Materials Science and Engineering, Mar. 15, 2000, B72(2-3):117-120.

Orgassa et al., "Spin Injection into Carbon Nanotubes and a Possible Application in Spin Resolved Scanning Tunnelling Microscopy," Nanotechnology, Institute of Physics Publishing, Bristol, GB, Sep. 2001, 12(3):281-284.

Rangelow et al., "Micromachined Ultrasharp Silicon and Diamond Coated Silicon Tip as a Stable Field Emission Electron Source and a Scanning Probe Microscopy Sensor with Atomic Sharpness," Journal of Vacuum Science and Technology: Part B, American Institute of Physics, Nov./Dec. 16 (6) 1998, 3185-3191.

Faircloth et al,. "Bilayer, nanoimprint lithography," J. Vac. Sci. Technol. B., Jul./Aug. 2000, 18(4):1-8.

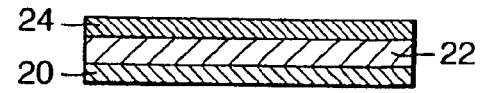
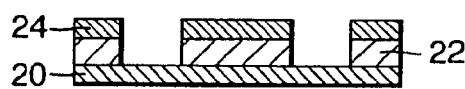
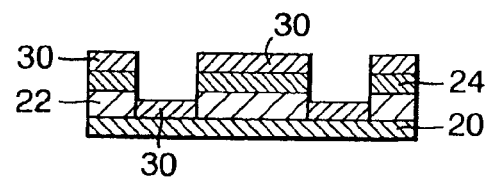
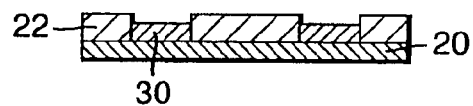
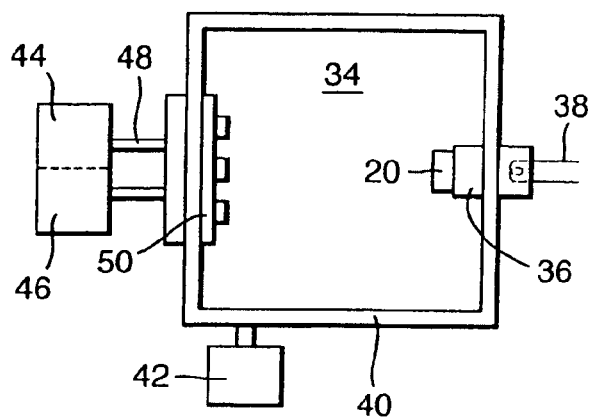

PRECISELY POSITIONED NANOWHISKERS AND NANOWHISKER ARRAYS AND METHOD FOR PREPARING THEM

CROSS-REFERENCE TO RELATED APPLICATIONS

This application is a Continuation of U.S. application Ser. No. 10/751,944, filed Jan. 7, 2004, now U.S. Pat. No. 7,608,147, which claims the benefit of priority of U.S. Provisional Patent Application Nos. 60/459,989, filed Apr. 4, 2003, 60/472,721, filed May 23, 2003, 60/512,771, filed Oct. 21, 2003, and 60/524,891, filed Nov. 26, 2003, the entirety of which is incorporated herein by reference.

BACKGROUND OF THE INVENTION

1. Field of the Invention

This invention relates generally to structures and devices produced by techniques of nanotechnology More specifically, the invention relates to such structures and devices incorporating at least one element, essentially in one-dimensional form, and that is of nanometer dimensions in its width or diameter, and that is produced by the so-called Vapour-Liquid-Solid (VLS) mechanism. For the purposes of this specification, such element will be termed a "nanowhisker".

2. Brief Description of the Prior Art

Nanotechnology covers various fields, including that of nanoengineering, which may be regarded as the practice of engineering on the nanoscale. This may result in structures ranging in size from small devices of atomic dimensions, to much larger scale structures for example on the microscopic scale. Commonly, such structures include nanostructures. Typically, nanostructures are devices having at least two dimensions less than about 1 µm (i.e., nanometer dimensions). Ordinarily, layered structures or stock materials having one or more layers with a thickness less than 1 µm are not considered to be nanostructures. Thus the term nanostructures includes free-standing or isolated structures having two dimensions less than about 1 µm that have functions and utilities that are different from larger structures and are typically manufactured by methods that are different from conventional procedures for preparing somewhat larger, i.e., microscale, structures. Thus, although the exact boundaries of the class of nanostructures are not defined by a particular numerical size limit, the term has come to signify such a class that is readily recognized by those skilled in the art. In many cases, an upper limit of the size of the at least two dimensions that characterize nanostructures is about 500 nm. In some technical contexts the term "nanostructure" is construed to cover structures having at least two dimensions of about 100 nm or less. In a given context the skilled practitioner will recognize the range of sizes intended. In this application the term "nanostructure" or "nanowhisker" is intended to refer to an elongated structure having at least two transverse dimensions less than about 1 µm, as indictated above.

Nanostructures include one-dimensional nanoelements, essentially in one-dimensional form, and that are of nanometer dimensions in their width or diameter, and that are commonly known as a nanowhisker, nanorods, nanowires, nanotubes, etc.

As regards nanowhiskers, the basic process of whisker formation on substrates, by the so-called VLS (vapour-liquid-solid) mechanism, is well known. A particle of a catalytic material, usually gold, for example, on a substrate is heated in the presence of certain gases to form a melt. A pillar forms under the melt, and the melt rises up on top of the pillar. The result is a whisker of a desired material with the solidified particle melt positioned on top. (See E. I Givargizov, Current Topics in Materials Science, Vol. 1, pages 79-145, North Holland Publishing Company, 1978). The dimensions of such whiskers were in the micrometer range.

Although the growth of nanowhiskers catalyzed by the presence of a catalytic particle at the tip of the growing whisker has conventionally been referred to as the VLS (Vapour-Liquid-Solid process), it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For purposes of this application, the term "VLS process", or VLS mechanism, or equivalent terminology, is intended to include all such catalyzed procedures wherein nanowhisker growth is catalyzed by a particle, liquid or solid, in contact with the growing tip of the nanowhisker.

International Application Publication No. WO 01/84238 discloses in FIGS. 15 and 16 a method of forming nanowhiskers wherein nanometer sized particles from an aerosol are deposited on a substrate and these particles are used as seeds to create filaments or nanowhiskers.

For the purposes of this specification the term nanowhiskers is intended to mean one-dimensional nanoelements with a width or diameter (or, generally, a cross-dimension) of nanometer size, the elements having been formed by the so-called VLS mechanism. Nanowhiskers are also referred to in the art as "nanowires" or, in context, simply as "wires", and such terminology, as used in this application, is equivalent to the term "nanowhiskers"

Positioning whiskers at selected positions on a substrate is desirable for an integration of whisker technology with current semiconductor component technology.

Several experimental studies on the growth of nanowhiskers have been made, the most important reported by Hiruma et al. They grew III-V nano-whiskers on III-V substrates in a metal organic chemical vapor deposition (MOCVD) growth system. (See K. Hiruma, et al., *J. Appl. Phys.* 74, page 3162 (1993); K. Hiruma, et al., *J. Appl. Phys.* 77, page 447 (1995); K. Hiruma, et al., *IEICE Trans. Electron.* E77C, page 1420 (1994); K. Hiruma, et al., *J. Crystal Growth* 163, pages 226-231 (1996)) Their approach relied on annealing a thin Au film to form the seed particles. In this way, they achieved a homogeneous whisker width distribution, the mean size of which could be controlled by the thickness of the Au layer and the way this layer transforms to nanoparticles. With this technique, it is difficult to control the size and surface coverage separately.

Sato et al., *Appl. Phys. Lett.* 66(2), 9 Jan. 1995, disclose an attempt to grow four nanowhiskers, the position or site of each nanowhisker being predetermined by use of four respective windows in an $SiO_2$ mask. The mask was then removed and growth was initiated. The results were, in general, unsatisfactory for producing a structure with nanowhiskers sufficiently precisely positioned for electronics/photonics components, one reason being that the nanowhisker growth site could not be accurately localised, on account of the use of a thin film for forming the seed particle. Further the structure consisting of four nanowhiskers was not extended to include a large number of nanowhiskers such as is necessary for many applications.

U.S. Pat. No. 5,332,910 discloses a micro-cavity laser comprising a plurality of semiconductor rods arranged at a distance equal to an integer sub-multiple of light emitted from the semiconductor rod. In one embodiment, a focussed ion beam was used to create seeds in a substrate from which nanowhiskers were grown. In another embodiment, nanowhiskers were grown by MOCVD in etched holes in an $SiO_2$ mask.

A component that is of considerable interest is a photonic bandgap array. This comprises an array of a large number of elements (that may be projections or holes) in a substrate and that provide a different refractive index from the surrounding medium. Selective area MOVPE growth (SA-MOVPE) has been used to develop two-dimensional photonic bandgap structures, but these appear of limited applicability. (See Akabori et al., *Physica* E13, pages 446-450, March 2002).

Work has also been carried out for forming photonic band gap structures from carbon nanotubes, where single-seeded arrays have been synthesized using methods such as self-assembly nanosphere lithography and optical lithography. (See K. Kempa et al., *Letters*, Vol. 3, No. 1, pages 13-18, 19 Nov. 2002). However tubes are not ideal structures for forming areas of different refractive index.

In co-pending U.S. patent application Ser. No. 10/613,071, filed Jul. 7, 2003, the contents of which are incorporated herein by reference and co-pending International Application PCT/GB2003/002929, a method of producing arrays of nanowhiskers is described suitable for use as photonic bandgap structures.

SUMMARY OF THE INVENTION

In general terms, the invention comprises a nanotechnological or nanoengineered structure comprising at least one nanowhisker located at a predetermined site with an accuracy of location that is within a predetermined dimensional tolerance, sufficient for use in an electronics/photonics component.

The invention further comprises a nanoengineered structure comprising a multiplicity of nanowhiskers in a predetermined spatial configuration, the nanowhiskers being disposed within the configuration at predetermined sites to within a predetermined dimensional tolerance.

The invention further comprises a nanoengineered structure comprising an array of a large number of nanowhiskers in a predetermined spatial configuration, the nanowhiskers being disposed within the configuration at predetermined sites to within a predetermined dimensional tolerance. For the purposes of this specification, "array" is intended to mean an assembly of about 1000 one-dimensional nanoelements; in all circumstances, the array comprises more than 500 such elements, and may commonly comprise more than about $10^6$ such elements.

Such structures in accordance with the invention have many applications, for example photonic band gap structures, displays such as Field Emitting Displays, electromedical devices with a large number of probes/sensors, or electronic/photonics components such as memory circuits where a large number of elements are included at predetermined positions.

In the situation where one or more nanowhiskers are employed for example in a photonics/electronics circuit, where the nanowhisker has to be positioned extremely accurately with respect to adjoining parts of the circuit, the invention provides a mechanism for such positioning.

The invention also comprises methods of producing such structures.

At least in a preferred embodiment, the invention comprises a method for producing a structure including at least one nanowhisker on a substrate, the method comprising:

providing at least one mass of a catalytic material on a surface of a substrate that is of a predetermined material at a predetermined position on the surface, annealing the substrate to remove surface oxide and to form from each said mass a respective catalytic seed particle, applying heat and introducing at least one material in gaseous form such as to grow epitaxially, from each catalytic seed particle by the VLS process (as defined above), a nanowhisker of a predetermined material, and wherein annealing and nanowhisker growth conditions are regulated, such as to maintain the nanowhisker within a predetermined tolerance of position from said predetermined position.

The annealing step removes surface oxide. This oxide layer gives a different wetting behavior for the mass than a perfect crystalline surface with free atomic bonds. A perfect crystal surface wets the mass much better, so it sticks. If the native oxide is removed inhomogeneously, due to dirt or other variations this may interfere in an unpredictable manner with nanowhisker growth. In accordance with the invention, it has been found that the annealing step plays a significant part in accurate positioning of the nanowhisker. It has been found that an obstacle to precise positioning of the nanowhiskers in the array is that the catalytic mass may move from its predetermined site. An issue in preventing movement is formation of a catalytic seed particle from the catalytic mass. During the annealing step, the catalytic mass melts and forms an interface with the substrate, through which atoms of the substrate material are absorbed, to alloy with the catalytic material, thus forming a catalytic seed particle. The more material is absorbed, and the closer the alloy becomes to a eutectic composition, the faster supersaturation conditions can be achieved for subsequent nanowhisker growth. As the catalytic mass melts, it is important that the interface formed, essentially determined by surface tension "wetting" considerations, provides a surface area that is such as to hold the mass in its initial position and to permit adequate. diffusion of atoms across the interface. If the wetting is insufficient, the mass may tend to form a ball with only a small interface, with a high risk that the ball may migrate rapidly across the surface. Alternatively if the wetting effect is excessive, the mass may spread out across the surface, with a high risk of fragmentation and growth of a nanowhisker at an unpredictable position.

A number of process parameters play a role in this issue, For example while the temperature should be high enough to remove oxide and provide a clean substrate surface, it should not be so high as to cause the mass to absorb excessive substrate material, and to "eat" into the surface. Particularly in the case of semiconductor III-V or II-VI materials, there may occur evaporation from the substrate of group V or VI element, creating a large number of free atomic bonds that may contribute to migration of the mass. To counteract evaporation, annealing may take place in an atmosphere containing appropriate group V or VI material.

A further important consideration is the initial shape and material constitution of the catalytic mass. The mass may include, in its initial constitution, separate regions of catalytic material, e.g. gold, and a material that will alloy with the catalytic material, e.g. indium, and assist in establishing supersaturation conditions for nanowhisker growth. This reduces the requirement for the mass to alloy with the substrate material in forming a seed particle, and hence increases the stability of the mass and its resistance to migration forces. As preferred, a sandwich of layers of catalytic/alloying/catalytic material is employed.

As regards the shape of the mass, it has been found that an optimal shape is one that upon melting retains approximately the same interface, in position and area, with the substrate. In this way, the mass, as it changes to a catalytic seed particle, tends to "stick" to its original position, and does not spread out, nor reduce its area of contact that may cause migration across the substrate surface. A preferred shape for a mass of pure catalytic material is a disc with a diameter: height ratio of 3:1; this provides the same interfacial area when it melts into a theoretically perfect semi-sphere. In practice it has been found that a ratio between 10:1 and 2:1 is acceptable. However for a catalytic mass containing a region of alloying material, it has been found that a much higher ratio, e.g. 50:1, is acceptable, since there is a reduced need for the catalytic mass to interact with the substrate surface. In general terms, during the formation of a catalytic seed particle from the catalytic mass, the holding force of the wetted interface with the substrate surface should resist forces causing migration of the mass across the surface.

In a first aspect therefore, the invention provides a method for producing a structure including at least one nanowhisker on a substrate, the method comprising:

providing a substrate of a predetermined material, and providing at least one mass of a catalytic material on a surface of the substrate at a predetermined position on the surface, applying heat and introducing at least one material in gaseous form such as to create a respective catalytic seed particle from each said mass, and to grow, from the catalytic seed particle, epitaxially, by the VLS process (as defined above), a nanowhisker of a predetermined material, and wherein each said mass is such that during the formation of the catalytic seed particle, forces causing the mass to migrate across said surface are less than a holding force across a wetted interface on the substrate surface.

In a further aspect, the invention provides a nanoengineered structure comprising a substrate of a predetermined material, and at least one mass of a catalytic material formed on the substrate surface in a predetermined position, wherein each said mass is such that, upon heating and melting to form a catalytic seed particle for subsequent nanowhisker growth, a wetted interface with the substrate is formed such that forces causing the mass to migrate across the surface are less than the force provided by the wetted interface holding the mass in its predetermined position.

As regards the initial formation of the masses of catalytic material, this may be carried out by an electron beam lithography lift off process, or, as preferred from cost considerations, a nanoimprint lithography method wherein a stamp is used to define the masses in their predetermined positions.

In accordance with the invention, it has been found that a factor in determining accurate positioning is the time in which nucleation of a nanowhisker takes place. By "nucleation" is meant the initiation of the process for epitaxial growth by the VLS method wherein upon the application of heat, atoms of the nanowhisker material are absorbed in the catalytic material to form an alloy, and when supersaturation conditions are achieved, the nanowhisker begins to form between the catalytic seed particle and the substrate at the growth site. Once this nucleation stage has been achieved, the possibility that the nanowhisker may move from its growth site is greatly reduced. In accordance with the invention, it has been found that this nucleation time should be less than a characteristic time for mobility. As regards the "characteristic time" for mobility of a catalytic mass on the surface, this naturally depends on the material compositions of the mass and the substrate surface. Further it will depend on the temperature, since the higher the temperature, the more active will be the catalytic mass, the substrate surface, and gases and vapours surrounding the growth site: this will increase the tendency for movement. The mobility will also depend on the amounts of material introduced in gaseous form at the growth site, since movement may occur if there is insufficient such material, or if there is an imbalance between two gaseous material (e.g., group III-containing material and group V-containing material). Further the mobility will depend on the state of the substrate surface, and the amount of substrate material that can easily take part in the growth process. The "characteristic time" may be expressed as the time for the catalytic mass to move a certain distance. For example this distance may be the maximum desired tolerance for movement from the predetermined growth site. This may be in terms of the mass dimensions, for example the time taken for the mass to move by a distance equal to its own diameter. Alternatively the distance may be a fraction of the distance between nearest neighbours growth sites, say 10%, representing the desired accuracy of positioning.

The invention further provides a method for producing a structure including at least one nanowhisker on a substrate, the method comprising:

providing a substrate of a predetermined material, providing at least one mass of a catalytic material on a surface of the substrate at a predetermined position on the surface, applying heat and introducing at least one material in gaseous form such as to grow epitaxially, from each catalytic mass by the VLS process, a nanowhisker of a predetermined material, and wherein nanowhisker growth conditions are regulated such that the time for growth nucleation of a nanowhisker at a said predetermined position is less than a characteristic time for the mobility of the respective mass on the substrate surface such as to maintain the nanowhisker within a predetermined tolerance of position from said predetermined position.

Commonly, the nanowhisker is a III-V compound, grown on a substrate containing a group III metal such as indium, gallium etc. However the invention is not limited to growth of III-V compounds, but includes any compound, such as II-VI (CdSe for example) and group IV semiconductors (Si, Ge).

As regards the substrate material, and the material of the nanowhiskers, these are not commonly the same, but nevertheless there may be some relationship between the materials in order to achieve satisfactory growth. Thus for example where the substrate is a group IV material such as silicon or germanium then the nanowhisker may also be a group IV material. Where the nanowhisker is of a III-V material or a II-VI material, the substrate may be of a material which also contains or comprises a group III or a group II metal. Thus for example where the nanowhiskers are of indium phosphide, the substrate may be of a material that includes indium or gallium.

Further it has been found desirable to regulate activity of one or more elements of nanowhisker material in gaseous form around each site, so as to regulate growth of the nanowhisker. Where for example a III V semiconductor compound is being grown, it is preferred to regulate the activity of the group V element such as phosphorous, arsenic etc. If this further element is present in gaseous form around the nanowhisker site and has excess activity, then in order to provide more group III material to balance the reaction, this may force the catalytic mass to "search" for group III material by migration on the substrate surface. Likewise, if the activity of the group V material is too weak, then proper nanowhisker growth may not occur. For an MOVPE process, where cracking of the organometallic molecules takes place in the vicinity of the growth sites, this implies close control over reaction temperature, and gas volumes. For CBE however, the cracking of the group V molecules takes place in cracking cells, remote from the growth site, and there is more freedom in selecting a growth temperature and gaseous flow rates.

In accordance with the invention, a structure, produced by the aforesaid process, consists of an array of a large number of nanowhiskers in a predetermined spatial configuration, the nanowhiskers being disposed within the configuration at predetermined sites to within a predetermined dimensional tolerance. It has been found that a very high accuracy can be achieved, as illustrated particularly in Example 7 below. Typically, the accuracy is such that the deviation of an actual position of a nanowhisker from a target site in an array of nanowhiskers positioned on a substrate is not greater than about 3.6% of the distance between adjacent target sites of nanowhiskers in the array. Preferably such deviation in actual position is not greater than about 1% of the distance between adjacent target sites of nanowhiskers in the array.

From another point of view, the positional deviation of an individual nanowhisker from its target position can, in accordance with the invention, be no more than a diameter of the whisker, preferably less than half the diameter, more preferably less than 20% of the diameter, still more preferably less than 1% of the diameter, and still even more preferably no more than 0.5% of the diameter.

It has been found that arrays of nanowhiskers in accordance with the invention are produced in extremely accurate geometric structures, wherein each nanowhisker is sited extremely closely to its target or allotted position. This permits use of the array in structures where a large number of nanowhiskers have to be employed and positioned very accurately. Such structures may include, for example, a complex electrical circuit, a display system, or a photonic bandgap array. Examples of these structures are disclosed in our copending U.S. patent application Ser. No. 10/613,071 filed 7 Jul. 2003, the contents of which are incorporated herein by reference.

For the specific application of photonic bandgap (PBG) arrays, what is required is a regular geometric structure of nanowhiskers at predefined locations, i.e., a lattice of points having a defined periodicity. The periodicity depends on the wavelength of radiation to be received by the PBG, but typically the nanowhiskers may be arranged with their axes ideally located on the lattice points with a nearest neighbour distance of about 1 micrometer. The diameter of the nanowhiskers in such a photonic bandgap array should generally be in the range of about 10%-20% of the period of the PBG lattice. Accordingly, the diameter of the nanowhiskers in such an array should generally be of the order of 100 nanometers, e.g., in a range of about 100-200 nanometers. The tolerance or tolerable deviation of the position of an individual nanowhisker in the array from its lattice point should be on the scale of about 5% of the period of the PBG lattice, i.e., about 50 nanometers for a 1 micrometer lattice.

The invention is applicable to any method of epitaxial growth of nanowhiskers by the VLS process. One particularly preferred epitaxial growth process is MOVPE (MOCVD). Another preferred epitaxial growth technique is Chemical Beam Epitaxy (CBE), where organometallic molecules are introduced into a reaction chamber that is at such a low pressure, that the molecules form beams that are directed towards the growth substrate. Such a technique is described in detail in our co-pending U.S. patent application Ser. No. 10/613,071, filed Jul. 7, 2003, the contents of which are incorporated herein by reference. With CBE, the difficulties in achieving appropriate growth conditions for accurately positioned nanowhiskers are increased.

It is preferred, as a measure for controlling migration of catalytic masses over the substrate surface during growth, to provide a mask of suitable inert material. The mask may be applied as a layer completely covering the substrate and catalytic masses; when heat is applied the catalytic mass permeates the mask material, to permit growth of nanowhiskers. Alternatively the mask may be apertured, each aperture containing a catalytic mass. This can be performed by a lithographic technique for example.

In a further aspect, the invention provides a method for producing a structure comprising at least one nanowhisker on a substrate, the method comprising:

providing a substrate, providing at least one mass of catalytic material on a surface of the substrate, each mass being located at a respective predetermined position on the surface, providing a mask on the substrate surface, applying heat and introducing at least one material in vapour form such as to grow by Chemical Beam Epitaxy and the VLS process (as defined above), a nanowhisker by way of each catalytic mass, of controlled height, diameter and position, and wherein said mask inhibits both growth on the substrate surface and lateral movement of the catalytic masses.

In the case where an apertured mask is employed, it is desirable that the apertures be defined with sufficiently small dimensions that the catalytic mass formed within the aperture is constrained from migration or movement from its predefined position. Commonly, during production of the mask, an apertured mask is formed and then the catalytic material is deposited within the apertures. It is desirable that the mass be of sufficient thickness (usually a height: diameter ratio of 1:3 is desirable), that in an initial process step wherein the catalytic masses are heated to produce seed particles, that the seed particle that is normally in molten form is within a distance less than its own diameter from the edge of the mask. The edge of the mask forms a mechanical barrier to the seed particle, and since the catalytic material does not "wet" the mask, on account of the surface tension properties, this effectively constrains the catalytic mass to its predetermined position. With this constraint, clearly the mobility of the catalytic mass on the substrate surface is decreased significantly as compared to the situation without a mask.

In a further aspect, the present invention provides a nanoengineered structure including at least one nanowhisker on a substrate, a substrate of a predetermined material, a mask of a further material on the substrate surface and being apertured with at least one aperture in a predetermined site and of predetermined diameter, and a nanowhisker projecting from the or each aperture, the base of each nanowhisker at the substrate surface being of a distance from the edge of the mask defining the respective aperture by an amount which is less than about the diameter of the nanowhisker.

As regards photonic band gap arrays, or photonic crystals produced in accordance with the invention, in a further embodiment, where the CBE process is employed, as described in detail in our co-pending U.S. patent application Ser. No. 10/613,071, filed Jul. 7, 2003, 3-dimensional photonic band gap array structures are provided wherein each nanowhisker of the array is formed as a series of alternating segments of two materials with different refractive indices, as described below.

In a further embodiment, each nanowhisker of the photonic crystal is formed with segments of different materials, with sharp heterojunctions therebetween, to provide a quantum dot within the nanowhisker operable as an LED. At least one of the LED structures is activated by connection to suitable contacts, to provide a light source for transmission of light through the remainder of the photonic crystal structure.

BRIEF DESCRIPTION OF THE DRAWINGS

Preferred embodiments of the invention will now be described with reference to the accompanying drawings wherein:

FIGS. 7a-e illustrate the steps in the formation of catalytic particles on a substrate within apertures in a mask, and subsequent growth of nanowhiskers by a CBE process, in accordance with a second embodiment of the invention;

FIG. 7f is a schematic illustration of a CBE chamber;

FIG. 9 shows SEMs of a fourth example of the invention.

FIG. 10 shows SEMs of a fifth example of the invention.

FIG. 11 shows SEMs of a sixth example of the invention.

DESCRIPTION OF THE PREFERRED EMBODIMENTS

Figure 1A:
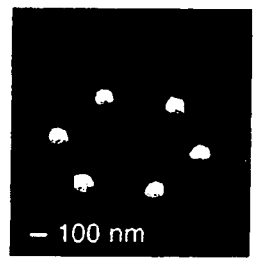
FIG. 1 (a) is an SEM micrograph of a first example of the invention, of a single hexagonal cell prior to growth for formation of a photonic bandgap array. Gold dots of approximately 125 nm diameter and 45 nm thickness can be seen on the substrate surface. (b) The same structure as in (a) but after growth. The wires have a top diameter of 140 nm and base diameter of 200 nm. The length is approximately 1 μm (45° viewing angle)

As indicated above, the invention provides a method for producing a structure including at least one nanowhisker on a substrate, wherein a nanowhisker is grown by the VLS method. In order to achieve the requisite precision in positioning the nanowhiskers, the catalytic seed particles must be precisely located on the substrate and must not move any significant distance before the nanowhisker begins to grow at the position on the substrate occupied by the catalytic particle. In certain embodiments of the invention, the catalytic seed particles are formed in openings on a mask formed on the surface of the substrate and confined within the mask openings as whisker growth begins. In other embodiments, the catalytic seed particles are arranged in predetermined positions on the surface of the substrate, and the particles are melted under conditions such that precursor materials for forming the nanowhiskers, supplied as gases, will form a molten alloy with the catalytic particle and crystallize at the substrate surface to provide a nucleus for growth of the nanowhisker. The conditions of nucleation and growth, including temperature, composition of the catalytic particle, surface coverage with oxide, and the like are adjusted such that during the formation of the catalytic seed particle, forces causing the molten particle mass to migrate across the substrate surface are smaller than a holding force provided by a wetted interface between the catalytic particle and the substrate surface.

Accordingly, as indicated above, in one embodiment of the process of the invention an annealing step is conducted that removes surface oxide. The surface oxide layer has different surface properties as to wettability by the molten catalytic metal mass than a perfect crystalline surface with free atomic bonds. A perfect crystal surface wets the catalytic mass much better, providing a surface force that tends to hold the catalytic particle at a fixed position on the substrate surface. If the native oxide is removed inhomogeneously, due to dirt or other variations, this may interfere in an unpredictable manner with nanowhisker position and growth. In accordance with at least one embodiment of the invention, it has been found that the annealing step plays a significant part in accurate positioning of the nanowhisker. It has been found that an obstacle to precise positioning of the nanowhiskers in the array is that the catalytic mass may move from its predetermined site. An issue in preventing movement is formation of a catalytic seed particle from the catalytic mass. During the annealing step, the catalytic mass melts and forms an interface with the substrate, through which atoms of the substrate material are absorbed, to alloy with the catalytic material, thus forming a catalytic seed particle. The more material is absorbed, and the closer the composition of the alloy becomes to a eutectic composition, the faster supersaturation conditions can be achieved for subsequent nanowhisker growth. As the catalytic mass melts, it is preferable that the interface formed, essentially determined by surface tension "wetting" considerations, provides a surface area that is such as to hold the mass in its initial position and to permit adequate diffusion of atoms across the substrate-catalytic particle interface. If the wetting is insufficient, the mass may tend to form a ball with only a small interface, with a high risk that the ball may migrate rapidly across the surface. Alternatively, if the wetting effect is excessive, the mass may spread out across the surface, with a high risk of fragmentation and growth of a nanowhisker at an unpredictable position.

A number of process parameters play a role in this issue. For example while the temperature should be high enough to remove oxide and provide a clean substrate surface, it should not be so high as to cause the mass to absorb excessive substrate material, and to "eat" into the surface. Particularly in the case of semiconductor III-V or II-VI materials, there may occur evaporation from the substrate of group V or VI element, creating a large number of free atomic bonds that may contribute to migration of the mass. To counteract evaporation, annealing may take place in an atmosphere containing appropriate group V or VI material.

A further important consideration is the initial shape and material constitution of the catalytic mass. The mass may include, in its initial constitution, separate regions of catalytic material, e.g. gold, and a material that will alloy with the catalytic material, e.g. indium, and assist in establishing supersaturation conditions for nanowhisker growth. This reduces the requirement for the mass to alloy with the substrate material in forming a seed particle, and hence increases the stability of the mass and its resistance to migration forces. As preferred a sandwich of layers of catalytic/alloying/catalytic material is employed.

As regards the shape of the mass, it has been found that an optimal shape is one that upon melting retains approximately the same interface, in position and area, with the substrate. In this way, the mass, as it changes to a catalytic seed particle, tends to "stick" to its original position, and does not spread out, nor reduce its area of contact that may cause migration across the substrate surface. A preferred shape for a mass of pure catalytic material is a disc with a diameter: height ratio of 3:1; this provides the same interfacial area when it melts into a theoretically perfect semi-sphere. In practice it has been found that a ratio between 10:1 and 2:1 is acceptable. However for a catalytic mass containing a region of alloying material, it has been found that a much higher ratio, e.g. 50:1, is acceptable, since there is a reduced need for the catalytic mass to interact with the substrate surface. In general terms, during the formation of a catalytic seed particle from the catalytic mass, the holding force of the wetted interface with the substrate surface should resist forces causing migration of the mass across the surface.

In particular, in view of the various effects of the growth conditions on the possibility of migration of the catalytic particles, the nanowhisker growth conditions are preferably regulated such that the time for growth nucleation of a nanowhisker at a predetermined position is less than a characteristic time for the mobility of the respective mass on the substrate surface such as to maintain the nanowhisker within a predetermined tolerance of position from said predetermined position.

In view of the above discussion, the skilled practitioner will recognize that a number of experimental parameters or factors are involved in selecting conditions that minimize the tendency of the catalytic particles to migrate across the substrate surface. However, taught by the above disclosure, the practitioner will be able to select the conditions appropriate for achieving the desired stability of position of the catalytic particles on the substrate surface. Such conditions will include the conditions assuring that forces causing the catalytic particle or mass to migrate across the surface are less than a holding force across a wetted interface on the substrate surface, and that the time required for growth nucleation is less than a characteristic time for the mobility of a catalytic particle or mass on the surface of the substrate.

As mentioned summarily above, the method of the invention is capable of providing one or more nanowhiskers precisely positioned at predetermined points on a substrate surface. Such precision may be extended to the formation of arrays ("nanonengineered structures") comprising very many nanowhiskers, even up to an array of $10^6$ or more nanowhiskers, precisely positioned in relation to one another and/or a predetermined reference point on the surface.

The precision required in a given practical embodiment will vary depending on the particular requirements of the application and on the size of the nanowhiskers or array of nanowhiskers that is used. Those skilled in the art will also recognize that initial positioning of nanomasses of material that become the catalytic particles is subject to limitations arising from difficulties in forming and manipulating such small objects. Thus, the precision attainable by lithographic techniques such as are conventional in the art, and used in the examples described herein, is subject to well-known limitations imposed by the physics and chemistry of the resist layers, the resolution of a particular pattern exposure apparatus, and the like. For example, patterns having features with dimensions of the order of 500 nm can be produced relatively easily; but features with dimensions of the order of 20 nm are very difficult to produce and position precisely on a surface.

Analysis of a particular structure produced at a nanoscale may also be difficult and can be limited by the resolution of available observation equipment, e.g., scanning electron microscopes (SEMs).

However, according to the invention, the position on the surface of a substrate of a nanowhisker formed by the process of the invention may be precisely controlled to achieve the precision required in a given application. For example, if nanowhiskers of relatively large diameter, e.g., 200 nm-500 nm (or more) are prepared, variations in the size of the nanowhiskers themselves may be greater than the precision with which they are positioned on the surface. However, for small nanowhiskers, e.g., 20 nm or the like, the positional accuracy may be limited by the accuracy with which the catalytic particles can be positioned (e.g., by lithographic techniques) on the substrate surface.

In any case, according to the method of the invention, the precision with which the nanowhiskers are positioned on the substrate surface can be achieved by precise positioning of the catalytic masses and will not be significantly degraded by the growth process.

The precision with which a nanowhisker is positioned on a substrate surface may also be defined in terms of the diameter of the nanowhisker itself. Such a definition may be more useful where, among a plurality of nanowhiskers, the spacing is relatively close, i.e., the spacing between adjacent nanowhiskers is a few diameters thereof. Under such a criterion, it is according to the invention to position nanowhiskers such that the distance between neighboring nanowhiskers does not deviate from the predetermined distance by more than about 20% of the diameter of the nanowhisker. Preferably such deviation will be less than about 10% of the diameter of the nanowhisker and more preferably not more than about 5% of the diameter of the nanowhisker.

The precision with which the nanowhiskers and arrays thereof are defined is discussed above in terms of percentage deviation from a predetermined dimension because such a definition is generally useful in a particular practical application. Furthermore, such a definition in terms of percentage deviation from a predetermined dimension may take account of a lack of precision in positioning the catalytic particles, e.g., by lithography, or in the techniques used to measure the positions of the particles and analyze the deviations of those positions from a predetermined reference point. Consequently, in a particular embodiment the precision defined in linear dimensions might vary from that defined in another embodiment. In any case, deviations in the position of a nanowhisker from a predetermined reference point can be less than several nanometers, e.g., less than about 20 nm, preferably less than about 10 nm and most preferably about 5 nm or less.

As mentioned above, the catalytic seed particle may incorporate the elements of to be supplied to the growing nanowhisker, thus to form an alloy with the catalytic metal. For example the catalytic particle may be an alloy incorporating a proportion of a Group III element and a Group V element in a gold catalytic particle. If the catalytic mass deposited on the surface of the substrate is a pure material, e.g., pure gold, or is an incompletely saturated alloy of the catalytic metal and the growth materials, the catalytic particle may initially attack the substrate and dissolve some of the growth materials therefrom to form a fully saturated alloy. Inasmuch as such dissolution of material from the substrate may not proceed isotropically, it is possible that the catalytic particle may shift somewhat from its initial position before catalytic growth of the nanowhisker commences. Such a shift evidently would degrade the precision with which the nanowhisker is positioned on the substrate. Accordingly, it is preferred to incorporate at least some of the growth materials into the catalytic mass that is deposited on the surface of the substrate before the heated growth phase of the process is initiated. This can be accomplished, for example, by depositing a layered catalytic mass incorporating at least one layer of the catalytic metal, e.g., gold, and a layer of the growth material that is to form the nanowhisker, e.g., a III-V compound. When the growth step of the process is initiated, the catalytic metal and the growth material will form an alloy immediately, thus minimizing the tendency of the catalytic particle to attack the substrate. Evidently, incorporation of any amount of the growth material will tend to reduce the tendency of the catalytic particle to attack the substrate. However, although it is not excluded that some local dissolution of the substrate might be desired, e.g., to provide a more perfect interface for the base of the nanowhisker, it is generally preferred to incorporate a sufficient amount of the growth material into the catalytic mass as deposited to at least form a fully saturated alloy.

A preferred embodiment of the invention will be described of a lithographic fabrication method for synthesizing arrays of vertical nanowires with single-wire control. Electron beam lithography (EBL) and metal lift-off were used to define a pattern of gold discs, transformed by annealing into growth catalysing nanoparticles. Nanowires were then grown using metal-organic vapour phase epitaxy (MOVPE)

EXAMPLE 1

Figure 1B:
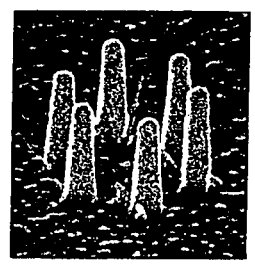

Samples were prepared from an n-type InP (111)B wafer. The (111)B substrate orientation was chosen since it is well known that the preferred wire growth direction is (111) B. The samples were cleaned on a spinner with acetone and isopropanol (IPA). They were then coated with poly(methylmethacrylate) (PMMA) photoresist and the disc pattern was transferred to the resist layer using a standard EBL technique. After development in methyl isobutyl ketone (MIBK) and rinsing in IPA, the samples were treated briefly with oxygen plasma to remove any resist residues from the exposed areas. After plasma treatment they were etched for 20 s in 4% hydrofluoric acid to remove surface oxide. The samples were then immediately transferred to a vacuum chamber where a gold film was deposited (thickness ranging from 17 to 45 nm and diameters of 125 nm) via thermal evaporation. The thickness was measured using a quartz crystal monitor. After metal lift-off by dissolution of the photoresist layer in hot acetone for 10 min, followed by 5 min in hot IPA, structures such as those shown in FIG. 1(a) were obtained. The samples were then transferred to a laminar flow MOVPE reactor cell and placed on a graphite susceptor. A hydrogen carrier gas flow of 6 l min$^{-1}$ at a pressure of 100 mbar (10 kPa) was used. A constant phosphine flow at a molar fraction of $1.5 \times 10^{-2}$ was supplied to the reactor cell and the samples were annealed at 580° C. for 10 min before growth. During this step the surface oxide is desorbed and the gold discs on the substrate surface alloy with the InP substrate. The temperature was then ramped down to 400° C. and growth of nanowires started when trimethylindium (TMI) was introduced into the reactor cell. TMI molar fractions between 3 and $6 \times 10^{-6}$ were used, giving V/III (PH3/TMI) ratios between 2500 and 5000. The growth time determines the wire length and a typical choice was 8 min. FIG. 1(b) shows structure (a) after growth. The wires have a top diameter of 140 nm and base diameter of 200 nm. Sample characterization was then carried out using a JSM 6400 F field emission scanning electron microscope, operated at 15 kV. It can be seen by comparison of the scanning electron micrographs (SEMs) before and after growth that the nanowhiskers have been grown essentially at the locations of the catalytic particles.

EXAMPLE 2

Figure 2:
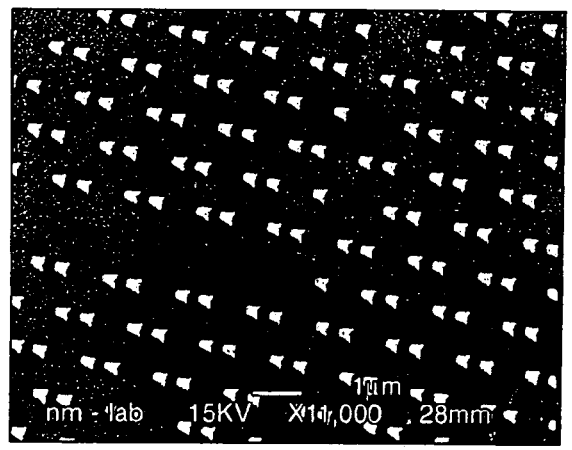
FIG. 2 is a tilted view SEM micrograph of an NIL stamp used in a second example of the invention. The stamp was fabricated from a one-inch Si wafer using Cr as mask for dry etching in $SF_6/O_2$. Each column has a height 300 nm and a top diameter of approximately 200 nm. The columns are arranged in a hexagonal pattern with a nearest neighbor distance of 1 μm.

This example is based on nano-imprint lithography (NIL). NIL is in many respects capable of producing results comparable to those of electron beam lithography (EBL), but at a considerably lower cost and with a much higher throughput. NIL was used to pattern InP substrates with growth-catalyzing gold particles. Growth of vertically aligned InP nanowires then took place in a metal-organic vapor phase epitaxy (MOVPE) system via the vapor-liquid-solid (VLS) growth. The material of choice was InP, but the method is effective equally well with other III-V materials. The (111)B substrate orientation was used since the preferred growth direction of nanowires is <111>B, and vertically aligned arrays were desired. The stamp for the nano-imprint process was made on a one-inch Si wafer using EBL and dry etching. A bi-layer of resist was used comprising ZEP520A7/PMMA950k that was exposed at 35 kV with a probe current of 20 pA. After resist development, 30 nm of Chromium was thermally evaporated and lifted-off in hot Microposit Remover S-1165 (Shipley). The metal layer was then used as etch mask to create the morphological structure of the stamp. Reactive ion etching in SF6/O$_2$ chemistry was used yielding a structure height of 300 mm, as measured by atomic force microscope (AFM). The columns are arranged in an hexagonal pattern with a nearest neighbor distance of 1 micrometer. The remaining Cr was removed by wet etching. The stamp was then treated for anti-sticking, by monolayer deposition of tridecafluoro-(1,1,2,2)-tetrahydrooctyltrichlorosilane (F13-TCS) in a nitrogen atmosphere. A scanning electron microscopy (SEM) image of the stamp after use is shown in FIG. 2.

To pattern the substrates with catalyzing gold dots, imprint was used followed by metal evaporation and lift-off. A bilayer resist scheme of a lift-off layer (LOL) and PMMA was used. First a 200 nm LOL film was spin-coated and soft-baked at 180° C. On top 100 nm of PMMA 50k was deposited and baked. Imprinting was done at 220° C., 50 bar and 3 minutes hold time. The samples were then ashed in oxygen plasma for 12 s and 5 mBar before development in MF319. The developer dissolves the LOL layer isotropically and thus creates the undercut profile necessary for good metal liftoff. The samples were then treated briefly with oxygen plasma, 12 s and 5 mbar, to remove any resist residues from the imprinted areas. After plasma treatment the samples were etched for 20 s in 4% hydrofluoric acid to remove surface oxide. The samples were then immediately transferred to a vacuum chamber where a 40 nm thick gold film was deposited via thermal evaporation. Metal liftoff was then performed in Remover S-1165 on a hotplate.

Nanowhiskers were then grown on the NIL defined sample using a laminar flow MOVPE system where the samples are placed on a RF-heated graphite susceptor. A hydrogen carrier gas flow of 6 l/min at a pressure of 100 mBar (10 kPa) was used. A constant phosphine flow at a molar fraction of $1.5 \times 10^{-2}$ was supplied to the reactor cell and the samples were annealed at 580° C. for ten minutes before growth. During this step the surface oxide is desorbed and the gold disks on the substrate surface alloy with the InP substrate. The temperature was then ramped down to 400° C., and growth of nanowires started when trimethylindium (TMI) was introduced into the reactor cell. A TMI molar fraction of $3 \times 10^{-6}$ was used and the growth time was 16 minutes. Sample characterization was then carried out using a JSM 6400 F field emission scanning electron microscope, operated at 15 kV.

Figure 3:
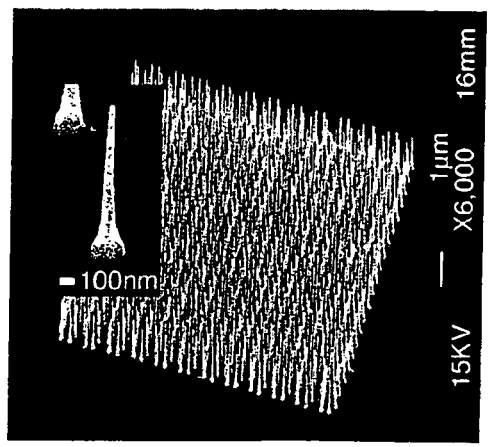
FIG. 3 is an SEM image of a high-density array of thin wires in accordance with a first embodiment of the invention, produced by the first example of the invention. The wires have a length of 3 μm and a top diameter of 50 nm while the base is thicker. The images are taken at 45° and 20° tilt for the main image and inset, respectively.
Figure 4A:
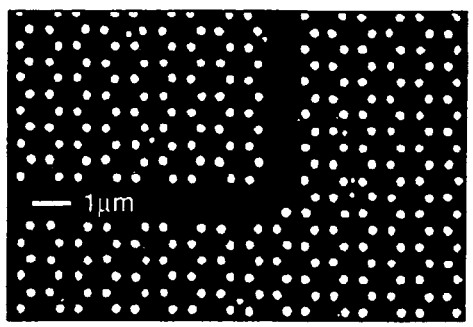
FIG. 4 comprises top (a) and 45° tilted (b) views of a nanowire honeycomb lattice structure. The possibility of defect engineering has been used to create a wave-guiding-like structure.
Figure 4B:
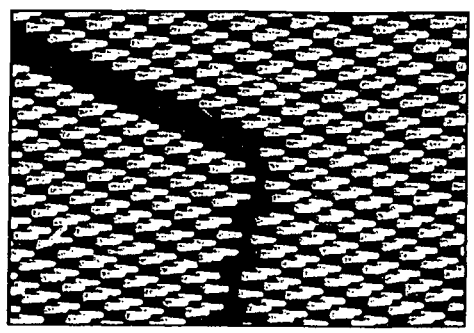

The lithographic method provides considerable freedom in design and a number of different patterns for various applications can be envisioned. Two structures with different wire densities and different wire diameters are shown in FIGS. 3 and 4 forming a first embodiment of the invention. In FIG. 3, a scanning electron microscope (SEM) image of a high-density array is presented. This $8 \times 8$ μ$^2$ array consists of hexagonal unit cells with a nearest neighbour distance of 250 nm. The catalysing particles consisted of gold discs with a diameter of 45 nm and a thickness of 17 nm. The importance of the thickness-to-diameter ratio will be discussed below. After growth, the resulting wires had a length of approximately 3 μm and a top diameter of 50 nm, while the base diameter (measured where the actual wire starts, just above the heavy 'foot') was larger, about 110 nm. The inset shows the shape of individual wires.

The structure in FIG. 4 is a pattern from the field of photonic crystals. In a photonic crystal the electromagnetic waves experience periodic modulation of the dielectric constant resulting in a photonic band gap, analogous to an electronic band gap in a semiconductor. For a two-dimensional photonic crystal this means that electromagnetic waves of a certain wavelength cannot propagate in the plane. However, defects in the photonic crystal will allow electromagnetic modes within the band gap and by engineering these defects the flow of light can be controlled and devices such as laser cavities and waveguides can be achieved. FIG. 4 is an example of a nanowire-based photonic crystal structure. This pattern consists of high-refractive-index pillars in air, forming a honeycomb lattice with an exceptionally large photonic band gap. A wire distance of 500 nm and a wire diameter of 140 nm were chosen which, for a dielectric constant of 11.4, are calculated to give a photonic band gap in the wavelength region around 500 nm. The lithographic nature of the method readily allows introduction of defects into the photonic lattice by changing the diameter of some wires, or by exclusion of certain wires altogether, as demonstrated in FIG. 3. Choosing the gold disc diameter prior to growth to be 125 nm with a thickness of 47 nm, the top wire diameter after growth was close to 140 nm, which was the desired value. The wire length was approximately 1 μm.

Figure 5:
FIG. 5 shows nanowires grown from gold dots with different thickness-to-height ratios, where the thickness was fixed at 17 nm. Starting from the left the diameters of the original dots were 50, 100, 200, 400 and 800 nm.

For ideal nanowire array growth, parameters such as the shape of the seed particles, the gas flows and temperature during growth must be optimized. The ability to produce a single vertical nanowire from each gold dot was found to be strongly dependent on the shape of the seeding particle. FIG. 5 shows the results obtained from discs with a thickness of 17 nm and with different diameters. Starting from the left the disc diameters prior to growth were approximately 50, 100, 200, 400 and 800 nm. The general trend is clear: a thin disc tends to break up and form many small catalysing particles, whereas a disc with a greater thickness-to-diameter ratio is more stable. An empirical thickness-to-diameter ratio of around 1/3 gives good results (in agreement with the very simple model of a disc transforming into a molten hemisphere during annealing without changing its diameter). In FIG. 5 the aspect ratio is optimized for the leftmost structure; however, the second structure from the left, with a ratio of 1/6, also shows good results, indicating a certain tolerance. The other extreme, with a very high thickness-to-diameter ratio, may be expected to cause problems with site control when the more pillar-like structure is to transform into a hemisphere during annealing. If wires with very different diameters are desired in the same structure, e.g. for photonic crystal applications, multiple EBL patterning and metal evaporation might be necessary to obtain the optimal aspect ratio for each wire diameter. The catalysing particle consists of gold plus a certain amount of indium incorporated from the substrate during alloying. To a first approximation the wire diameter is then defined by the diameter of this catalysing particle. However, competing growth mechanisms on the {110} side facets make this true only for the top diameter. The base is often larger and tapering of the wires can be observed, as also reported in prior investigations. The tapering becomes stronger at higher temperatures and thus, for rod-like wires, low growth temperatures are preferable. The structures presented in FIGS. 3 and 4 contain a low density of unwanted defects. Such defects are caused by nanowhiskers or wires nucleating and growing at undesired positions, as well as wires that change growth direction during growth (kinking). Temperature and V/III ratio were observed to affect the tendency of the wires to kink. For the V/III ratios two extremes could be observed: a low V/III ratio caused frequent wire kinking, whereas a high V/III ratio caused problems associated with wire nucleation and low wire growth rates. When the V/III ratio is kept constant, the problem of wire kinking also becomes more severe for low temperatures, in agreement with previously reported results. Thus, if high-aspect-ratio, rod-like wires or nanowhiskers are desired one must find a compromise between low growth temperature, to minimize the tapering effect, and a higher temperature, to avoid kinking. A temperature of 400° C. was found to be suitable for these structures based on InP wires. Further optimization of fabrication parameters should minimize the presence of such defects, or eliminate them altogether This example demonstrates the synthesis of highly uniform arrays of vertical InP nanowires, as shown in FIGS. 3 and 4. The wires are individually seeded from catalytic gold particles and the method provides control over the location, diameter and length of the wires. Such a fabrication technique is important for nanowires as building blocks for specific applications. Applications based on arrays of nanowire devices may include producing two-dimensional photonic crystals and FEDs (Field Emission Displays) with nanowire cathodes. In combination with a technique for contacting vertically standing wires, single nanowire components (such as SETs and RTDs) could be combined to form more complex devices.

This example illustrates the use of MOVPE (MOCVD) process for achieving high positional accuracy of nanowhiskers within an array. With the MOVPE process, a relatively large amount of indium, present as TMI vapour molecules, is present at the nanowhisker growth sites, by reason of the relatively high pressure (10 millibars) within the reaction chamber. An additional factor is the working temperature. The working temperature is chosen for MOVPE at a relatively low value of about 400° C. so that there is little bulk growth on the substrate surface. However, the indium ions, when released after cracking of the TMI, may move a long distance to a growth site.

An additional factor is the activity of the phosphorous ions present when the phosphine gas is cracked at the growth site. The working temperature is chosen so that the activity matches the amount of indium present at the growth site so as to sustain growth without forcing the catalytic particle to gather more indium by moving from its predetermined site.

A further process for growth of nanowhiskers in accordance with the invention is chemical beam epitaxy (CBE) this is described in our co-pending U.S. patent application Ser. No. 10/613,071 filed Jul. 7, 2003. In CBE, the pressure within the reaction chamber is considerably lower by several orders of magnitude than that of MOVPE, and essentially one beam of material, TMI, and phosphorus in gaseous form, is used for formation of indium phosphide. The phosphorus containing molecules are cracked remote from the growth site. This implies that it is easier to control the process, since working temperature and phosphorus activity can be separated, and to maintain positional accuracy of the catalytic particles.

Figure 6A:
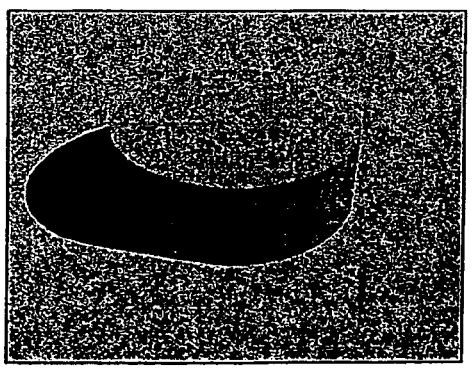
FIGS. 6a and 6b are schematic diagrams of a mass of catalytic material before and after melting to form a catalytic seed particle, in accordance with the invention.
Figure 6B:
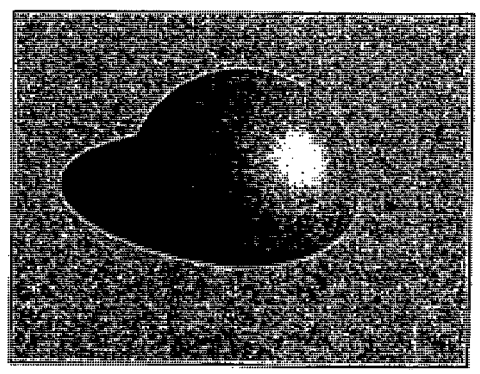

It has been found that the initial shape of the mass deposited on the substrate is important for accurate positioning of the catalytic particle formed from the mass, whether or not a mask is used. FIG. 6 illustrates an ideal situation, where the melted mass occupies exactly the same surface area as the initial mass. FIG. 6a shows a gold catalytic mass formed as a disc, and FIG. 6b illustrates that melting of the disk has created a perfect hemisphere. A calculation, neglecting the fact that the gold droplet absorbs material from the substrate, shows that to keep the same diameter at the interface with the substrate, in the molten droplet as in the original disk, the diameter should be three times the gold thickness. Let the unprimed quantities be before heating and the primed after heating. Let t be the gold thickness and r the radius. The volumes V and V' are assumed the same $V=V'$ $\pi r^2 \times t = 4\pi r^3/3 \cdot 2$ $t=2r/3$ or $d=3t$ In practice, it has been found that a d:t ratio between 12:1 and 2:1 can produce acceptable results.

While it is possible by accurate and precise control over the operating parameters within a CBE process, to provide accurately positioned nanowhiskers within a nanowhisker array, an alternative and preferred technique, in accordance with a second embodiment of the invention, is to provide a mask on the substrate surface which performs two functions, firstly that of preventing bulk growth on the surface, and secondly inhibiting movement of the catalytic particles. A mask in accordance with the invention is termed an epi-mask (epitaxy inhibitor).

Turning to FIG. 7a, a substrate 20 of gallium arsenide with a (111) surface has formed thereon an epi-mask 22. This may be an inorganic material such as silicon dioxide, or it may be an organic polymer material of which various types are commercially available.

As shown in FIG. 7b a photoresist material 24 is applied to layer 22 and is patterned for example using an electron beam. The photoresist material is then etched to produce a predetermined pattern as shown in FIG. 7c wherein apertures are produced in the photoresist material and the underlying epi-mask to define the predetermined sites for nanowhisker growth.

Subsequently, as shown in FIG. 7d a layer of gold of predetermined depth is applied as at 30. A subsequent etching process removes the photoresist material layer 24 and the gold therein 30 so as to leave the epi-mask 22 with the gold present to a predetermined depth (one third of the width of the aperture) within each site aperture 30 (FIG. 7e).

The substrate as shown in FIG. 7e, after appropriate cleansing operations, is transferred to a CBE reaction chamber 34 as shown in FIG. 7f. The substrate 20 is mounted on a metal sample holder 36 connected to a heater 38. Around the chamber a ring 40 is filled with liquid nitrogen to provide a cryoshroud. Vacuum pumps 42 are provided.

Sources 44, 46 of TMIn, TBP in liquid phase are stored in constant temperature baths and by controlling the temperature for liquid source the partial pressure of the vapour above the liquid is regulated. The vapour is fed into the chamber through a pipe complex 48 to a source injector 50. Source injector 50 injects a molecular beam into the chamber with stable and uniform intensity. The group III material decomposes at the substrate surface i.e. gallium. As opposed to this the group V phosphorous material will be decomposed before injection into the growth chamber at high temperatures in the injectors. These injectors are called cracking cells and their temperature is kept around 900° C. The source beam impinges directly on the heated substrate surface. Either the molecule gets enough thermal energy from the surface substrate to dissociate all of its three alkyl radicals, leaving the elemental atom on the surface, or the molecule gets dispelled in an undissociated or partially dissociated shape. Which of these processes dominates depends on the temperature of the substrate and the arrival rate of the molecules. At higher temperatures this growth rate will desorption that will block sites.

By providing the mask 22, imbalances in the annealing step and nanowhisker growth step are prevented from causing movement of the gold catalytic seed particles on the substrate surface. When the seed particle is formed, its distance form the edge of the mask aperture is less than the diameter of the nanowhisker. This applies equally to the resultant nanowhisker.

EXAMPLE 3

Figure 8:
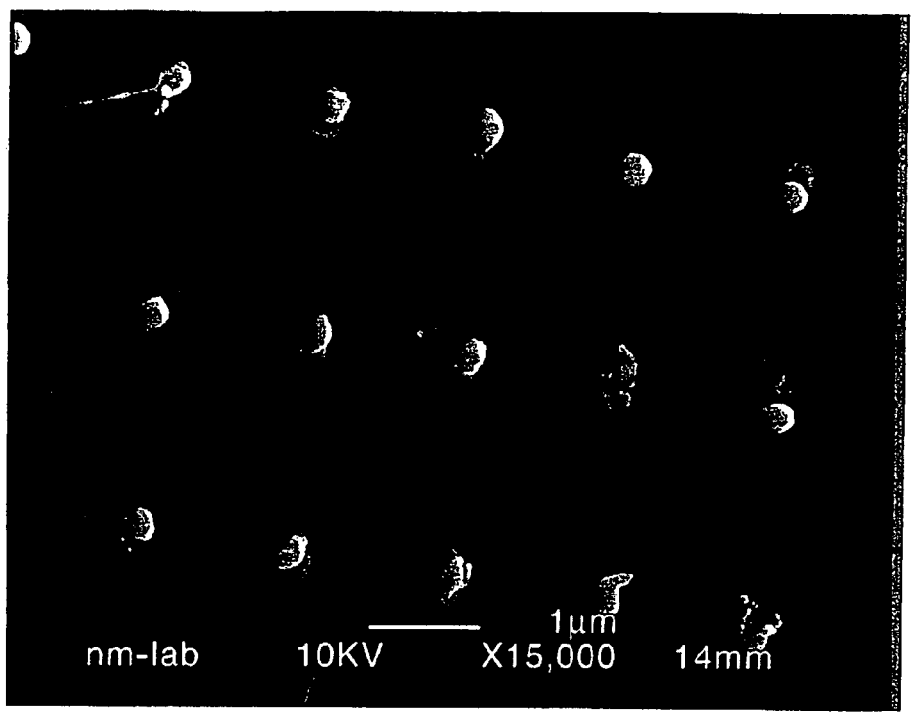
FIG. 8 is an SEM of a third example of the invention, taken from above and tilted to one side, showing use of a mask for locating the catalytic seed particles.

As shown in FIG. 8, a mask of silicon nitride, 27 nm thick, was formed on an InP substrate. Circular apertures were formed in the mask by a lithographic process. Gold catalytic particles were formed in the circular apertures within the mask. Nanowhiskers were grown form the gold catalytic particles. The nanowhiskers substantially filled the mask apertures, with a narrow gap between the nanowhisker and the edge of the mask aperture.

EXAMPLE 4

Figure 9A:
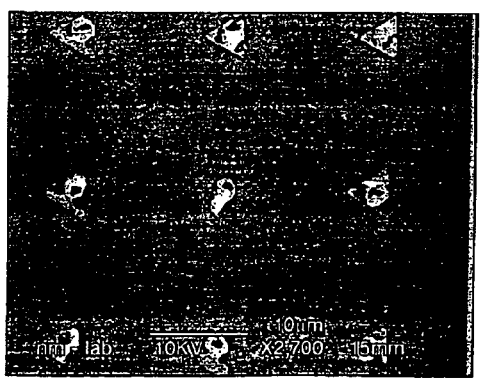
FIG. 9a: GaAs (111)B with 45 nm Au coated with a 7 nm layer of SiOx. Heated at 450° for 15 min.
Figure 9B:
FIG. 9b: GaAs (111)B with 45 nm Au. Heated at 450° for 15 min.

Gold catalytic particles were formed on a GaAs substrate. By depositing a thin oxide of SiOx over the entire structure just before the particles were formed, movement of the gold particle over the substrate was restricted. The result is shown in FIGS. 9a and 9b, where two samples are shown. They are identical with respect to manufacturing and heat treatment. The only difference is that FIG. 9a has a thin (7 nm) layer of SiOx oxide. This oxide is thermally evaporated from a source of SiO. Whether the oxide on the sample is SiO or SiO2 depends on the vacuum conditions in the evaporation chamber. As seen the thin oxide drastically changes the behaviour of the sample when heated. The migration is much less although a triangular formation can be seen. The melt migrates along the surface under the oxide. The original disk can be seen, indicating that the oxide forms a shell over the gold disk. Successful whisker growth was performed with a covering oxide. This means that the oxide is removed at growth temperature that is typically about 550°.

EXAMPLE 5—InAs (100) substrate

Figure 10A:
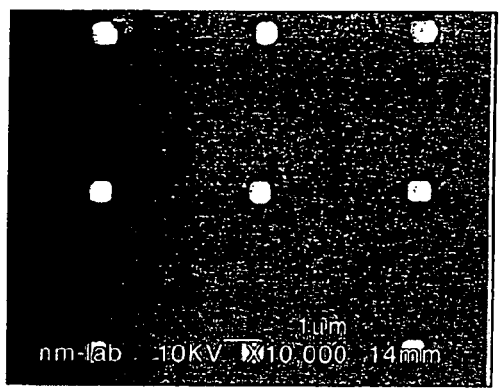
FIG. 10a: InAs (80) with a 45 nm Au—In—Au sandwich. Heated to 450° for 20 min. Original metal disk size was 540 nm.
Figure 10B:
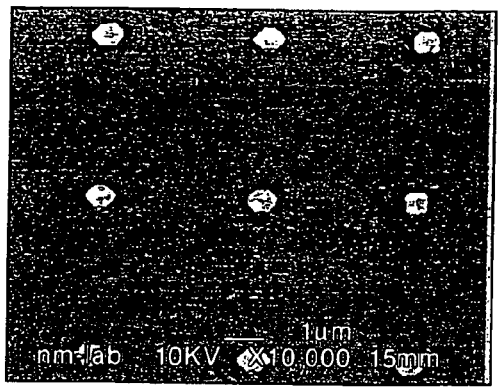
FIG. 10b: Same as the left sample but with pure gold.

At 451° C. with 38.4% In, for an Au-In mixture, there is a eutectic point. This composition was evaporated onto a sample in a 45 nm thick film. Au and In cannot be evaporated together at the same time, so a Au—In—Au sandwich was used with a thickness of ~14:17:14 nm respectively. A sample with pure gold was also fabricated for comparison. The samples were then heated at 455° for 20 minutes and the result can be seen in FIGS. 10a and 10b. FIG. 10a shows the sample with the Au—In—Au sandwich whereas FIG. 10b shows the sample with pure Au. The sample with In forms a droplet on the surface seemingly without having to incorporate a lot of In from the substrate. In the case of pure gold a lot of In has to be incorporated and the droplet digs its way down into the substrate. Thus it does not form a droplet on the surface but the top of the droplet is almost levelled with the surface. The droplets follow the crystal symmetries. The square, and sometimes rectangular, shape can be understood from the rectangular structure of the (100) surface. As a rule of thumb the smaller the feature sizes the more they tend to follow the crystal symmetry. The largest structures remained quite rounded whereas the smallest were almost entirely rectangular. Although the result was better for the sample with the mix of Au and In, the sample with pure Au also shows a very good result considering positioning. This means that either InAs is a better-suited material than GaAs or that the (100) surface is more suitable than the (111) surface considering positioning.

EXAMPLE 6 Au—In—Au sandwich on GaAs (111)B

Figure 11A:
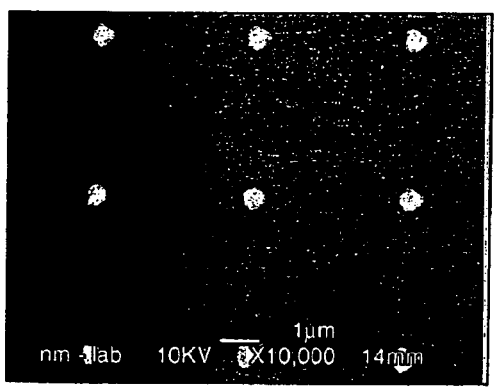
FIG. 11a: GaAs (91)B with a 45 nm Au—In-larger Au sandwich. Heated to 450° for 15 min.
Figure 11B:
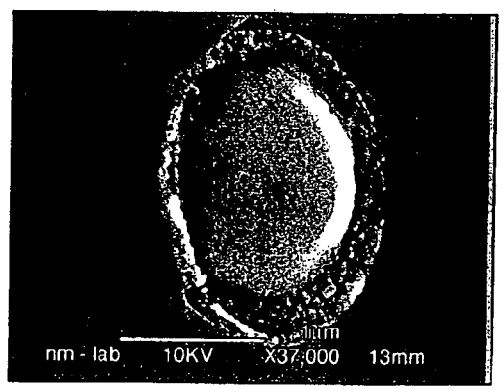
FIG. 11b: Close-up of one of the larger features. Original disk diameter 2 μm, meaning a shape of d=48t.

A sandwich of Au—In—Au on a GaAs substrate was employed. A GaAs (111) substrate is used since preferential growth direction for the whiskers in this system is (111). The sample above was evaporated with a 45 nm thick metal film comprising 14 nm Au: 17 nm In: 14 nm Au. The sample was then heated to 450° for 15 minutes. FIGS. 11a and 11b show satisfactory positioning of the catalytic particles. In this embodiment the In may the droplet, preventing it from absorbing a large amount of Ga from the substrate. The temperature, ~450°, is well within the temperature range suitable for growth of InAs whiskers which are usually grown between 410 and 460° in our system.

Figure 12A:
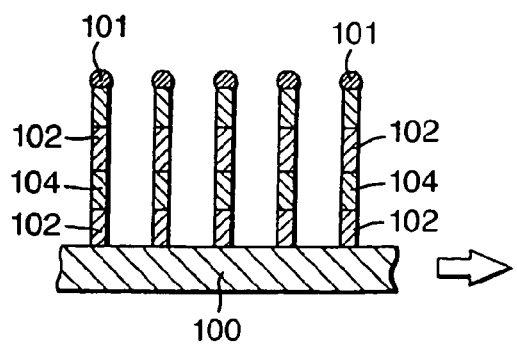
FIG. 12 shows a third embodiment of the invention for providing a three-dimensional photonic bandgap structure.

Referring to FIG. 12, there is shown a third embodiment of the invention for providing a three-dimensional photonic bandgap structure. The process described above with reference to FIG. 7 of the second embodiment is employed for providing gold catalytic masses 101 at each nanowhisker growth site. The result is shown in FIG. 12a wherein a substrate 100 of silicon has a 111 upper surface. Growth is initiated by means of a CBE process in order to grow segments 102 of silicon nanowhiskers. After a predetermined time, the constituents in the molecular beams injected into the reaction chamber are rapidly switched so as to induce growth of a germanium segment of nanowhisker 104 on top of the silicon segment. The process for forming abrupt heterojunctions between different materials within a nanowhisker is fully described in our co-pending U.S. patent application Ser. No. 10/613,071, filed Jul. 7, 2003.

Figure 12B:
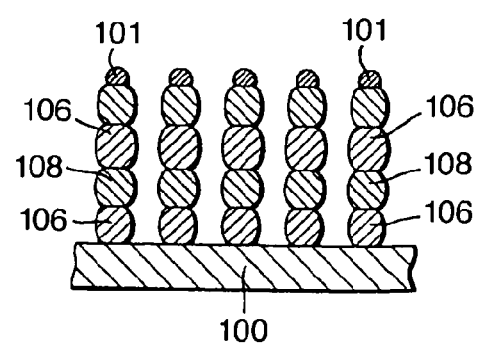

The result as shown is a nanowhisker comprising a large numbers of alternating segments of germanium and silicon. As an alternative, aluminium may be used instead of germanium. The nanowhisker is then subjected to heat in an oxidising environment so that the segments of silicon and germanium are transformed to their oxides, silicon dioxide and germanium oxide. Alternatively, if aluminium is used this is transformed to aluminium oxide (sapphire). As shown in FIG. 12b, the result is a nanowhisker with regions 106, 108 of different refractive index along its length. The length of the regions 106, 108 may be adjusted, and the result is a three-dimensional photonic bandgap structure where the site positions of the nanowhiskers provides the bandgap properties within two-dimensions, and the variations in refractive index along the length of the nanowhiskers provide the third dimension of the photonic bandgap structure.

Figure 13A:
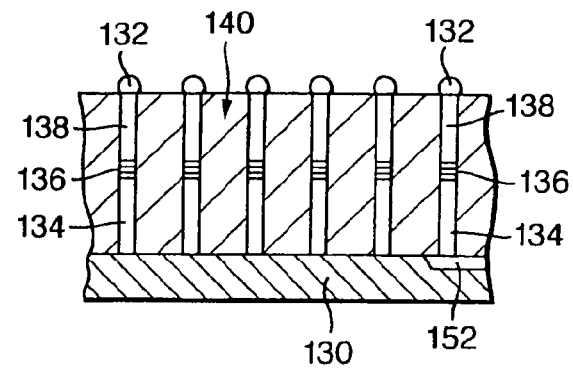
FIG. 13 shows a fourth embodiment of the invention for providing LED sources of light in a photonic band gap structure.

In a fourth embodiment, as shown in FIGS. 13a and b, there is shown a nanoengineered structure forming a photonic band gap array, together with integrated light sources for transmitting light through the array. The process described above with reference to FIG. 7 of the second embodiment is employed for providing gold catalytic masses at each nanowhisker growth site. The result is shown in FIG. 13a wherein a substrate 130 of indium phosphide has gold catalytic particles 132 formed thereon. Growth is initiated by means of a CBE process in order to grow segments 134 of InP nanowhiskers. After a predetermined time, the constituents in the molecular beams injected into the reaction chamber are rapidly switched so as to induce growth of an Indium Arsenide segment of nanowhisker 136 on top of the InP segment. A further segment of InP 138 is then grown on top of the InAs segment 136. The process for forming abrupt heterojunctions between different materials within a nanowhisker is fully described in our co-pending U.S. patent application Ser. No. 10/613,071, filed Jul. 7, 2003. The array is then encapsulated in a transparent matrix medium 140.

Figure 13B:
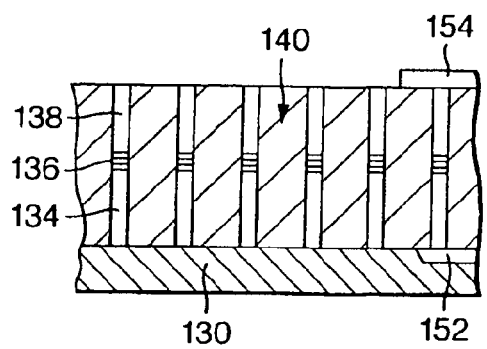

As shown in FIG. 13b, the result is an extremely small LED quantum dot structure. A whisker 150, selected from the whisker array has anode and cathode outer regions 134, 138 of indium phosphide either side of an inner region 136 formed of indium arsenide, so as to define a quantum well. Regions 134, 138 are connected to respective anode and cathode electrical contacts, formed as metallisation areas 152, 154. In contrast to planar devices, where because of the need for lattice matching and for relieving mismatch strain, only certain wavelengths are possible, an important point of this embodiment is that the wavelength of the LED is fully variable since the materials making up the diode may be of any desired composition to achieve a desired wavelength of emission.

Figure 14:
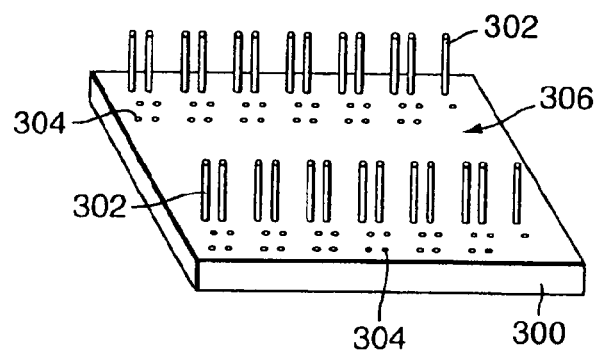
FIG. 14 shows a sixth embodiment of the invention for use as an NIL stamp.

FIG. 14 shows a fifth embodiment of the invention for use as a stamp in nano imprint lithography. A substrate 300 has an array of nanowhiskers 302 formed thereon, according to the process described in example 1, at respective sites 304 (only some of the nanowhiskers are shown for clarity). The nanowhiskers are grouped and configured so as to form a pattern 304, that when applied in the NIL process, produces a required nanostructure formation. The length of the nanowhiskers may be as long as required, more than 1 micrometer that permits nanostructures of arbitrary depth to be formed.

EXAMPLE 7

This example illustrates the precision with which nanowhisker arrays of the invention can be fabricated.

Figure 15:
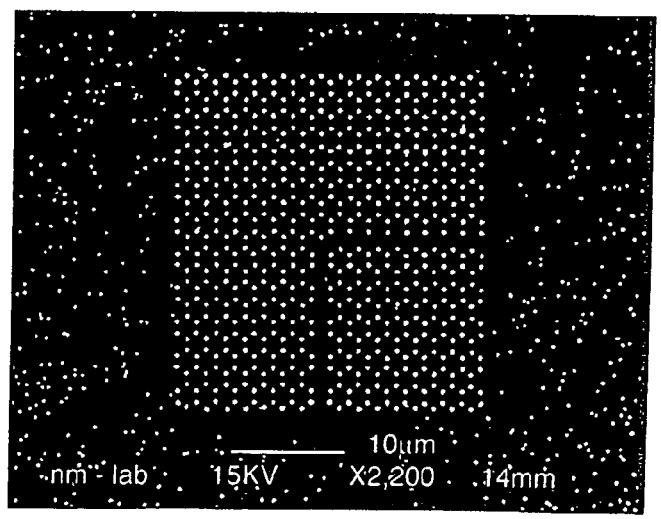
FIG. 15 shows a plan view of an array of nanowhiskers prepared according to the invention illustrating the precise positioning of nanowhiskers to form a large array thereof.

FIG. 15 shows a plan view of a nanowhisker array prepared according to the invention wherein the nanowhiskers are arranged in hexagonal pattern, the sides of the hexagons having a length of 1 μm.

Figure 16:
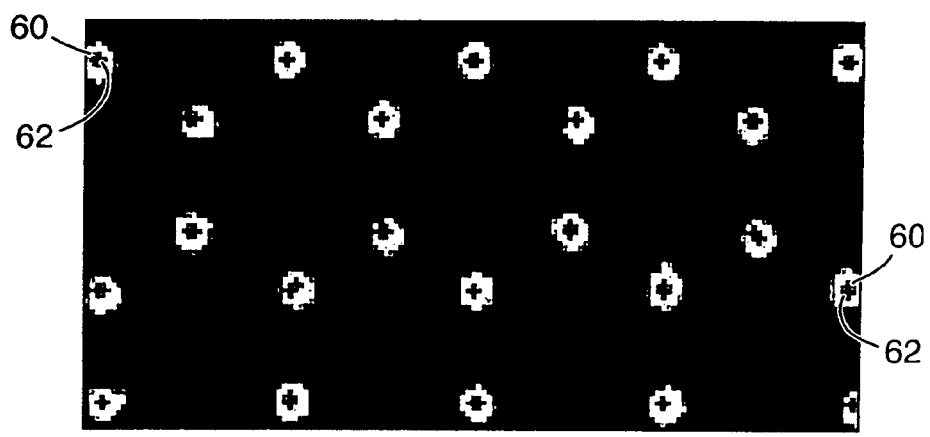
FIG. 16 shows an enlarged plan view of the array of FIG. 15 with the actual locations of the nanowhiskers indicated as well as the locations of the lattice points.
Figure 17:
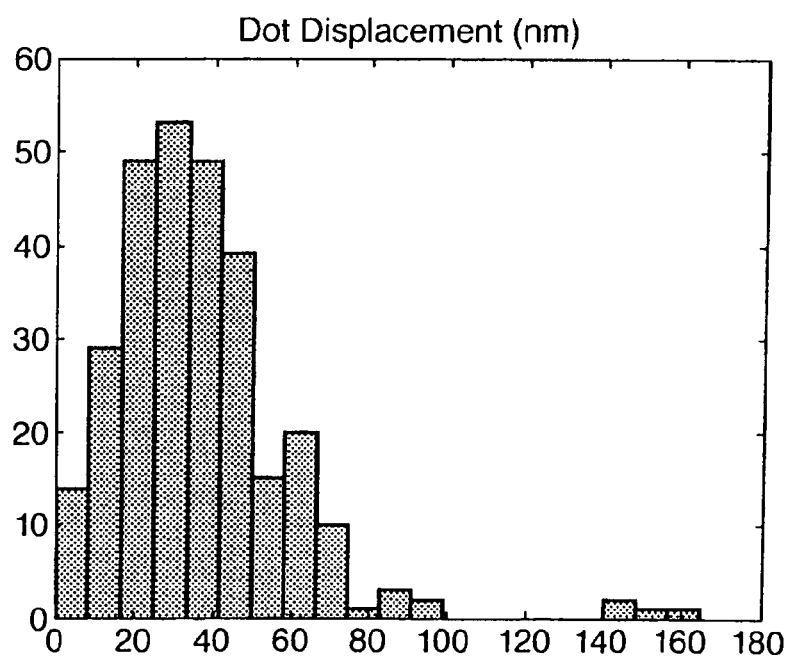
FIG. 17 is a histogram of the deviations of the actual locations of the nanowhiskers from the lattice points for the view of FIG. 16.

FIG. 16 shows an enlarged view of a portion of the array shown in FIG. 15 in which the positions of the nanowhiskers as determined by a computer program for analyzing such images have been determined for each nanowhisker and the positions have been indicated by crosses, such as cross 60. Also indicated in the FIG. 16 are the positions of the points of a lattice grid (the target positions of the nanowhiskers) generated by the computer program, indicated, for example by points such as cross 62. After the positions of the grid points and the locations of the individual nanowhiskers were determined by the computer program, differences between the grid poins and the actual position points were generated for each nanowhisker. FIG. 17 is a representation of the differences in the form of a histogram plot. Based on the data displayed in FIG. 17 it was determined that the mean displacement of the actual positions from the computer-generated lattice grid was 36 nm, with a standard deviation of 23 nm. For the structure illustrated these results can be compared with the lattice parameter (=side of the hexagonal cell) to yield the values in percent of mean displacement, 3.6% and standard deviation 2.3%. Moreover, for nearly all of the nanowhiskers, the deviation of each whisker from its target position is less than the diameter of the whisker, indeed less than half the diameter in most cases, with many of the whiskers deviating less than 20% of the diameter from the target position and even being within 1% to 5% of the diameter, or even essentially coincident with the target position (no more than 0.5% deviation).

We claim:

1. A method for producing a structure including at least one nanowhisker on a planar substrate, the method comprising:
providing the planar substrate of a predetermined material,
providing at least one mass of a metal catalytic material on a surface of the substrate at a predetermined position on the surface,
after the step of providing the at least one mass, annealing at a first temperature the at least one mass of metal catalytic material located on the surface of the planar substrate to alloy at least one other metal material with the at least one mass of metal catalytic material to create a metal alloy catalytic seed particle from each said mass and to create a wetted interface between the surface of the substrate and the metal alloy catalytic seed particle, and
after the step of annealing during which the metal alloy catalytic seed particle is created, epitaxially growing at a second temperature different from the first temperature a nanowhisker of a predetermined material from the metal alloy catalytic seed particle located on the substrate by introducing a first precursor gas flow to the metal alloy catalytic seed particle,
wherein each said mass is such that during the formation of the catalytic seed particle, forces causing the mass to migrate across said surface of the planar substrate are less than a holding force across the wetted interface between the surface of the planar substrate and the metal alloy catalytic seed particle.

2. The method according to claim 1, wherein the step of alloying at least one other metal material with the at least one mass of metal catalytic material comprises depositing the at least one other metal material on the at least one mass of metal catalytic material.

3. The method according to claim 2, wherein the at least one other metal material is deposited from a vapor phase on the at least one mass of metal catalytic material.

4. The method according to claim 3, wherein the at least one other metal material comprises a group III metal and the nanowhisker comprises a group III-V semiconductor nanowhisker comprising the group III metal.

5. The method according to claim 4, wherein the at least one other metal material comprises indium, the at least one mass of metal catalytic material comprises gold, the catalytic seed particle comprises a gold-indium alloy, and the nanowhisker comprises an indium containing group III-V semiconductor nanowhisker.

6. The method according to claim 2, wherein the substrate comprises an indium containing group III-V semiconductor substrate, the at least one other metal comprises indium, the metal catalyst seed particles comprise gold particles, the alloyed catalyst seed particles comprises gold-indium alloy particles, and the plurality of nanowhiskers comprise indium containing group III-V semiconductor nanowhiskers.

7. The method according to claim 1, wherein the nanowhisker comprises a compound semiconductor material including a same metal as the at least one other metal.

8. The method according to claim 7, wherein the at least one other metal material comprises a group III metal and the nanowhisker comprises a group III-V semiconductor nanowhisker comprising the group III metal.

9. The method according to claim 8, wherein the at least one other metal material comprises indium, the at least one mass of metal catalytic material comprises gold, the catalytic seed particle comprises a gold-indium alloy, and the nanowhisker comprises an indium containing group III-V semiconductor nanowhisker.

10. The method of claim 1, wherein the first temperature is high enough to remove oxide from a surface of the substrate.

11. The method of claim 1, wherein the first temperature is higher than the second temperature.

12. The method of claim 1, wherein the metal alloy catalytic seed particle comprises a disc shape with diameter to height ratio between 10:1 to 2:1.

13. The method of claim 1, wherein a deviation of an actual position of a nanowhisker from a target site in an array of nanowhiskers positioned on a substrate is less than about 3.6% of the distance between adjacent target sites of nanowhiskers in the array.

14. The method of claim 13, wherein the deviation is less than about 1%.

15. The method of claim 13, wherein the deviation is less than about 20 nm.

16. A method for producing a plurality of nanowhiskers on a planar substrate using nanoimprint lithography, the method comprising:
- forming a resist over the planar substrate;
- contacting the resist with a nanoimprint lithography stamp to imprint the resist;
- patterning the imprinted resist;
- depositing a catalyst metal layer over the patterned resist;
- lifting off the patterned resist covered by the catalyst metal layer to leave metal catalyst seed particles on the substrate;
- after the metal catalyst seed particles are left on the planar substrate, annealing at a first temperature the catalyst seed particles located on the substrate to alloy the catalyst seed particles with at least one other metal from the substrate to create alloyed catalyst seed particles and a wetted interface between the surface of the substrate and the alloyed catalyst seed particles; and
- after the step of annealing during which the alloyed catalyst seed particles are created, epitaxially growing at a second temperature different from the first temperature a plurality of nanowhiskers from the alloyed catalyst seed particles by introducing a first precursor gas flow to the alloyed catalyst seed particles,
- wherein each mass of the catalyst seed particle is such that forces causing the catalyst seed particle to migrate across said flat planar substrate are less than a holding force across the wetted interface between a surface of the planar substrate and the metal catalyst seed particle.

17. The method according to claim 16, wherein the substrate comprises a semiconductor substrate and the step of growing the plurality of nanowhiskers comprises epitaxially growing a plurality of semiconductor nanowhiskers on the substrate.

18. The method according to claim 17, wherein the semiconductor substrate comprises a III-V semiconductor substrate and the nanowhiskers comprise III-V semiconductor nanowhiskers.

19. The method according to claim 16, wherein the resist comprises a bilayer resist comprising a PMMA layer over a lift-off layer.

20. The method according to claim 19, wherein:
- imprinting the resist comprises imprinting the PMMA layer; and
- patterning the imprinted resist comprises ashing the imprinted PMMA layer and developing the lift-off layer.

21. The method according to claim 20, wherein the step of developing the lift-off layer comprises isotropically developing the lift-off layer to form an undercut profile.

22. The method according to claim 20, further comprising treating the substrate with oxygen plasma after the step of developing to remove resist residue from imprinted areas and etching the substrate to remove a surface oxide from exposed areas of the substrate.

23. The method according to claim 19, wherein the catalyst metal layer comprises a gold layer and the catalyst seed particles comprise gold catalyst seed particles.

24. A method for producing a structure including at least one nanowhisker on a planar substrate, the method comprising:
- providing the planar substrate of a predetermined material,
- providing at least one mass of a metal catalytic material on a surface of the planar substrate at a predetermined position on the surface,
- after the step of providing the at least one mass, annealing at a first temperature the at least one mass of metal catalytic material located on the planar surface of the substrate to alloy at least one other metal material with the at least one mass of metal catalytic material to create a metal alloy catalytic seed particle from each said mass and to create a wetted interface between the surface of the substrate and the metal alloy catalytic seed particle, and
- after the step of annealing during which the metal alloy catalytic seed particle is created, epitaxially growing at a second temperature different from the first temperature a nanowhisker of a predetermined material from the metal alloy catalytic seed particle located on the substrate by introducing a first precursor gas flow to the metal alloy catalytic seed particle,
- wherein each said mass is such that during the formation of the catalytic seed particle, forces causing the mass to migrate across said surface of the planar substrate are less than a holding force across the wetted interface between the surface of the planar substrate and the metal alloy catalytic seed particle and wherein the grown nanowhisker has a diameter of less than about 1 μm and wherein a positional deviation of the grown nanowhisker from the predetermined position of the substrate is less than the diameter of the nanowhisker.

25. The method of claim 24, wherein the positional deviation of the grown nanowhisker from the predetermined position on the substrate is less than 20% of the diameter of the nanowhisker.

26. The method of claim 24, wherein the positional deviation of the grown nanowhisker from the predetermined position on the substrate is less than 10% of the diameter of the nanowhisker.

27. The method of claim 24, wherein the positional deviation of the grown nanowhisker from the predetermined position on the substrate is less than 10 nm.

* * * * *